United States Patent
Mori et al.

(10) Patent No.: US 7,688,659 B2
(45) Date of Patent: Mar. 30, 2010

(54) SEMICONDUCTOR MEMORY CAPABLE OF TESTING A FAILURE BEFORE PROGRAMMING A FUSE CIRCUIT AND METHOD THEREOF

(75) Inventors: Kaoru Mori, Kawasaki (JP); Jun Ohno, Kawasaki (JP); Hiroyuki Kobayashi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 114 days.

(21) Appl. No.: 12/127,161

(22) Filed: May 27, 2008

(65) Prior Publication Data

US 2009/0040849 A1    Feb. 12, 2009

(30) Foreign Application Priority Data

Aug. 8, 2007    (JP) .............................. 2007-207041

(51) Int. Cl.
    *G11C 29/00* (2006.01)

(52) U.S. Cl. .................. 365/201; 365/233.15; 365/227; 365/230.03; 365/230.06; 365/203; 365/225.7; 365/200

(58) Field of Classification Search ............ 365/230.03, 365/230.06, 203, 225.7, 200, 201, 233.14, 365/233.15, 233.1, 227, 226
See application file for complete search history.

(56) References Cited

U.S. PATENT DOCUMENTS

| 5,815,449 | A  | * | 9/1998 | Taura ........................ 365/200 |
| 7,184,335 | B2 | * | 2/2007 | Boldt et al. ................. 365/201 |
| 7,397,715 | B2 | * | 7/2008 | Lim et al. ................... 365/201 |

FOREIGN PATENT DOCUMENTS

| JP | 06-052681 A | 2/1994 |
| JP | 11-312395 A | 11/1999 |
| JP | 2003-085998 A | 3/2003 |

* cited by examiner

*Primary Examiner*—Andrew Q Tran
(74) *Attorney, Agent, or Firm*—Arent Fox LLP

(57) ABSTRACT

Each program circuit outputs an operating specification signal indicating a first or second operating specification according to a program state. Each specification changing circuit is set by a corresponding block selection signal and outputs an operating specification signal indicating a second operating specification. Each timing control circuit changes an output timing of a precharge control signal for a bit line according to the operating specification signal. By the operating specification signal from the specification changing circuit, a failure can be detected in each memory block before programming a program circuit. Thereafter, the failure can be relieved by the program circuit. The output timing of the precharge control signal can be set for each memory block by a block selection signal without wiring a dedicated signal line for setting each specification changing circuit. Accordingly, increase in chip size can be minimized.

17 Claims, 20 Drawing Sheets

US 7,688,659 B2

SEMICONDUCTOR MEMORY CAPABLE OF TESTING A FAILURE BEFORE PROGRAMMING A FUSE CIRCUIT AND METHOD THEREOF

CROSS-REFERENCE TO RELATED APPLICATION

This application is based upon and claims the benefit of priority from Japanese Patent Application No. 2007-207041, filed on Aug. 8, 2007, the entire contents of which are incorporated herein by reference.

BACKGROUND

1. Field

The present embodiments relate to a semiconductor memory having a plurality of memory blocks.

2. Description of the Related Art

In a semiconductor memory such as a DRAM, a memory cell is coupled to one of a complementary bit line pair via a transfer gate which operates according to the voltage of a word line. In a read operation, data retained in the memory cell is output to one of the bit lines. The other of the bit lines is set to a precharge voltage before the read operation. The voltage difference in the bit line pair is then amplified by a sense amplifier and is output as read data. Generally, while the DRAM is on standby, the bit lines are set to the precharge voltage, and the word line is set to the ground voltage or the like.

For example, when a word line and a bit line short-circuit electrically and a failure occurs, the bad word line is replaced by a redundancy word line. Alternatively, the bad bit line pair is replaced with a redundancy bit line pair. However, the short circuit between the word line and the bit line physically exists even after the failure is relieved. Accordingly, even after the failure is relieved, a leak current flows from a precharge voltage line to the ground line via the short-circuited part. A DRAM having a large leak current is removed as a bad product.

To decrease a standby current failure that accompanies a short failure (hereinafter, also referred to as a cross short failure) between a word line and a bit line, there is proposed a method of coupling a precharge voltage line to bit lines and a sense amplifier in a certain period before a word line is activated (for example, refer to Japanese Laid-open Patent Publication No. H06-52681). In this method, all the bit lines are set to a floating state during a standby period in which an access operation is not performed.

When the semiconductor memory has a plurality of memory blocks, it is preferable that the countermeasure against a failure which sets the bit lines to a floating state during a standby period is implemented only in the memory block where the cross short failure exists. However, there is no technology proposed for detecting the cross short failure and relieving the failure for every memory block in a semiconductor memory having a plurality of memory blocks.

SUMMARY

According an aspect of an embodiment, a semiconductor memory has a plurality of memory blocks each having memory cells coupled to bit lines, a decoder, a plurality of block control circuits and a plurality of program circuits and a plurality of specification changing circuits corresponding to the memory blocks, and a plurality of timing control circuits corresponding to the block control circuits. For example, the semiconductor memory forms a system together with a controller which accesses the semiconductor memory.

The decoder activates one of block selection signals configured to select the memory blocks according to an address signal. The block control circuits are provided corresponding to the memory blocks respectively and each have a precharge circuit which couples the bit lines to a precharge voltage line according to a precharge control signal. The program circuits are provided corresponding to the memory blocks respectively, and each output an operating specification signal indicating a first operation mode when a non-volatile program unit is not programmed, and output an operating specification signal indicating a second operating specification when the program unit is programmed. The specification changing circuits are provided corresponding to the memory blocks respectively and set in response to activation of a corresponding block selection signal during a test mode, output the operating specification signal indicating the second operating specification while being set, and output the operating specification signal indicating the first operating specification when not being set. The timing control circuits are provided corresponding to the block control circuits respectively and each output the precharge control signal and change an output timing of the precharge control signal according to the operating specification signal from the program circuit or the specification changing circuit.

DETAILED DESCRIPTION OF THE EMBODIMENTS

Figure 1:
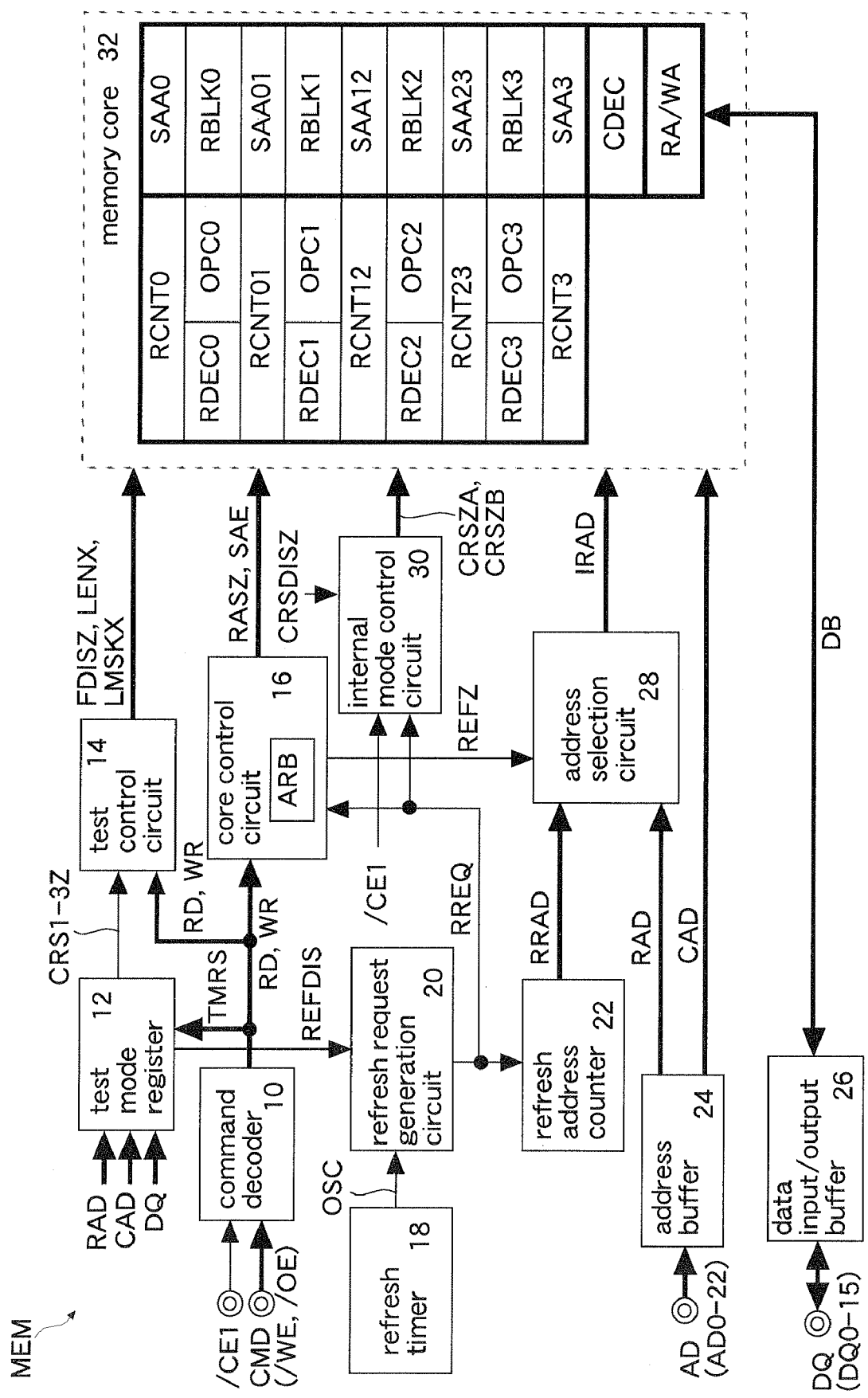
FIG. 1 is a block diagram illustrating a first embodiment.

Hereinafter, embodiments will be described, using the drawings. In the drawings, each signal line shown by the heavy line has a plurality of lines. Part of blocks to which the heavy lines are connected has a plurality of circuits. Each signal line through which the signal is transmitted is denoted by the same reference symbol as the signal name. Each signal starting with "/" and each signal ending with "X" represent negative logic. Each signal ending with "Z" represents positive logic. Each double circle in the drawings represents an external terminal.

FIG. 1 illustrates a first embodiment. A semiconductor memory MEM is, for example, an FCRAM (Fast Cycle RAM) of pseudo SRAM type. This FCRAM has DRAM memory cells and an interface of SRAM. The memory MEM has a command decoder 10, a test mode register 12, a test control circuit 14, a core control circuit 16, a refresh timer 18, a refresh request generator 20, a refresh address counter 22, an address buffer 24, a data input/output buffer 26, an address selection circuit 28, an internal mode control circuit 30 and a memory core 32.

Figure 18:
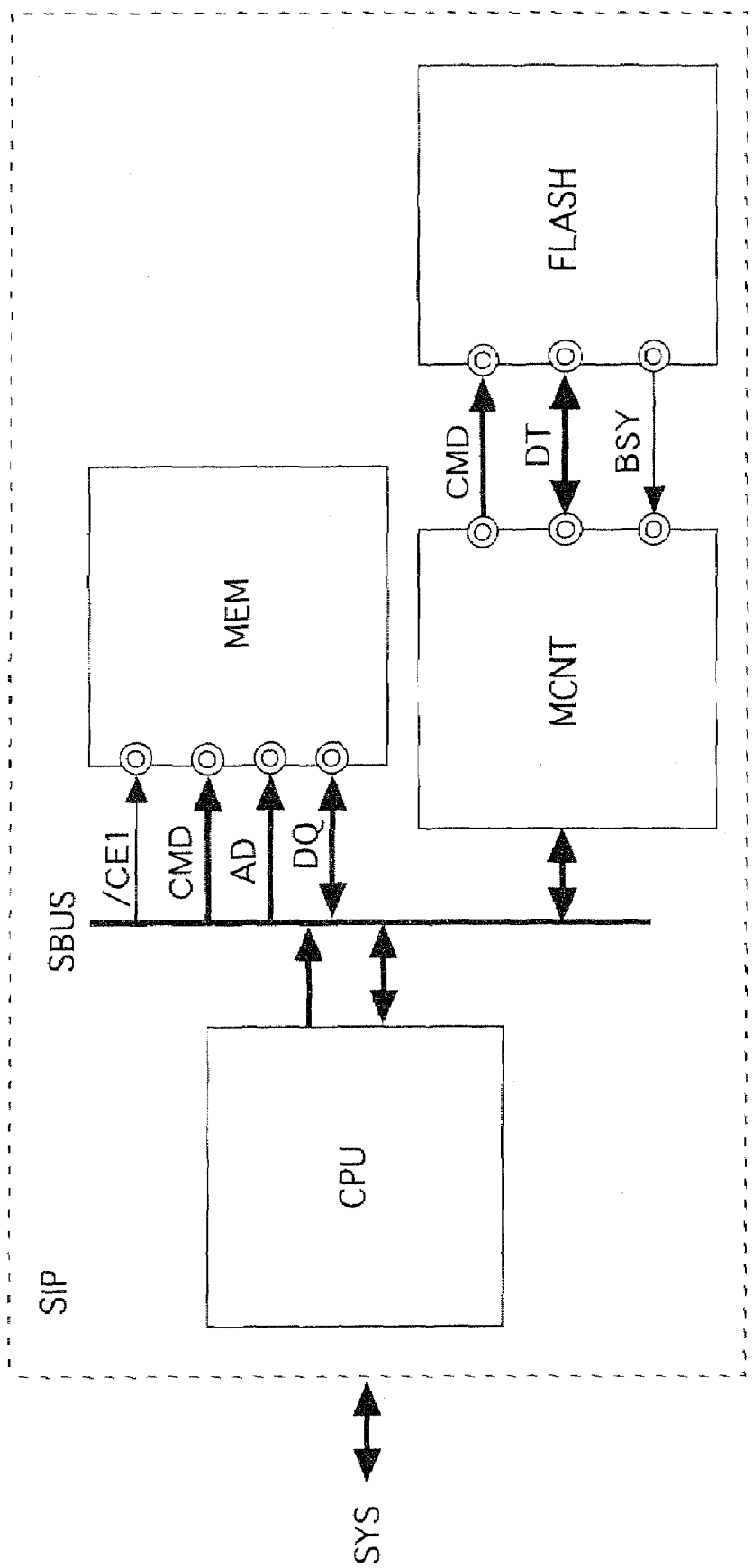
FIG. 18 is a block diagram illustrating a system of the first embodiment.

Although not illustrated in particular, the memory MEM has a redundancy circuit (a redundancy memory cell, a redundancy word line) for relieving a bad memory cell or the like, a redundancy fuse circuit for making the redundancy circuit become usable, and a redundancy control circuit. The redundancy fuse circuit stores a failure address. The redundancy control circuit detects a match of an address signal and the failure address, disables access to a normal memory cell and enables access to the redundancy memory cell. Note that the memory MEM forms a system together with a CPU, as illustrated in FIG. 18, which will be described later.

The command decoder 10 outputs a command, which is recognized according to logic levels of a chip enable signal /CE1 and a command signal CMD, as a read command RD and a write command WR or a test mode register set command TMRS for setting the test mode register 12 or the like, so as to perform an access operation of the memory core 32. The read command RD and the write command WR are external access requests for performing the access operation of the memory core 28. For example, the command signal CMD is a write enable signal /WE and an output enable signal /OE.

The test mode register 12 has a plurality of registers which are set by receiving a row address signal RAD, a column address signal CAD and a data signal DQ synchronously with the test mode register set command TMRS. For example, the test mode register 12 outputs cross set signals CRS1Z, CRS2Z, CRS3Z according to values of predetermined three bits of the row address signal RAD. The cross set signals CRS1-3Z are output for detecting a cross short failure in a test mode, which will be described later. Further, the test mode register 12 outputs a refresh disable signal REFDIS when a refresh disable bit is set. Note that the signal supplied to the test mode register 12 may be at least one of the row address signal RAD, the column address signal CAD and the data signal DQ.

Figure 5:
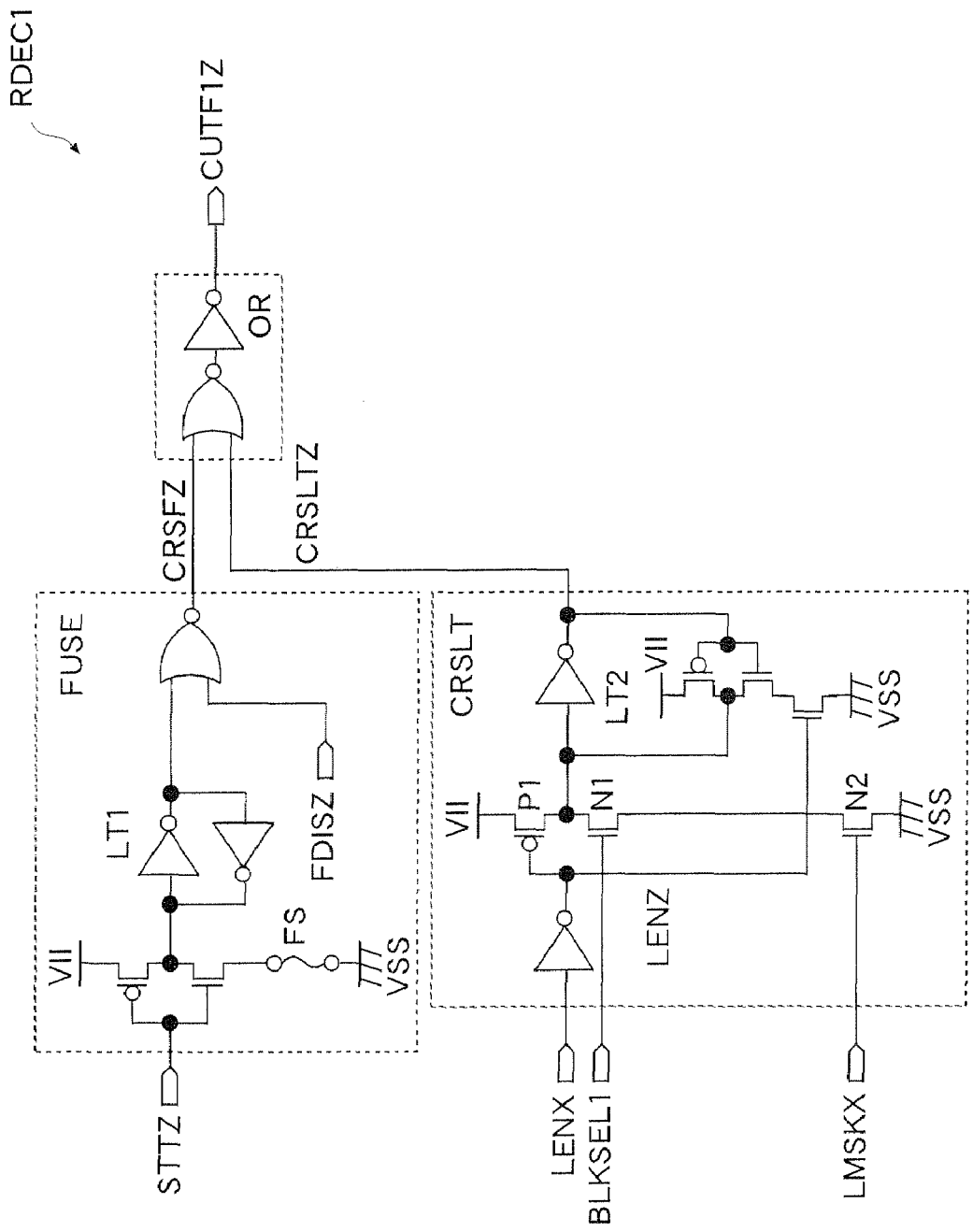
FIG. 5 is a circuit diagram illustrating details of a fuse circuit and a cross latch circuit illustrated in FIG. 4.
Figure 16:
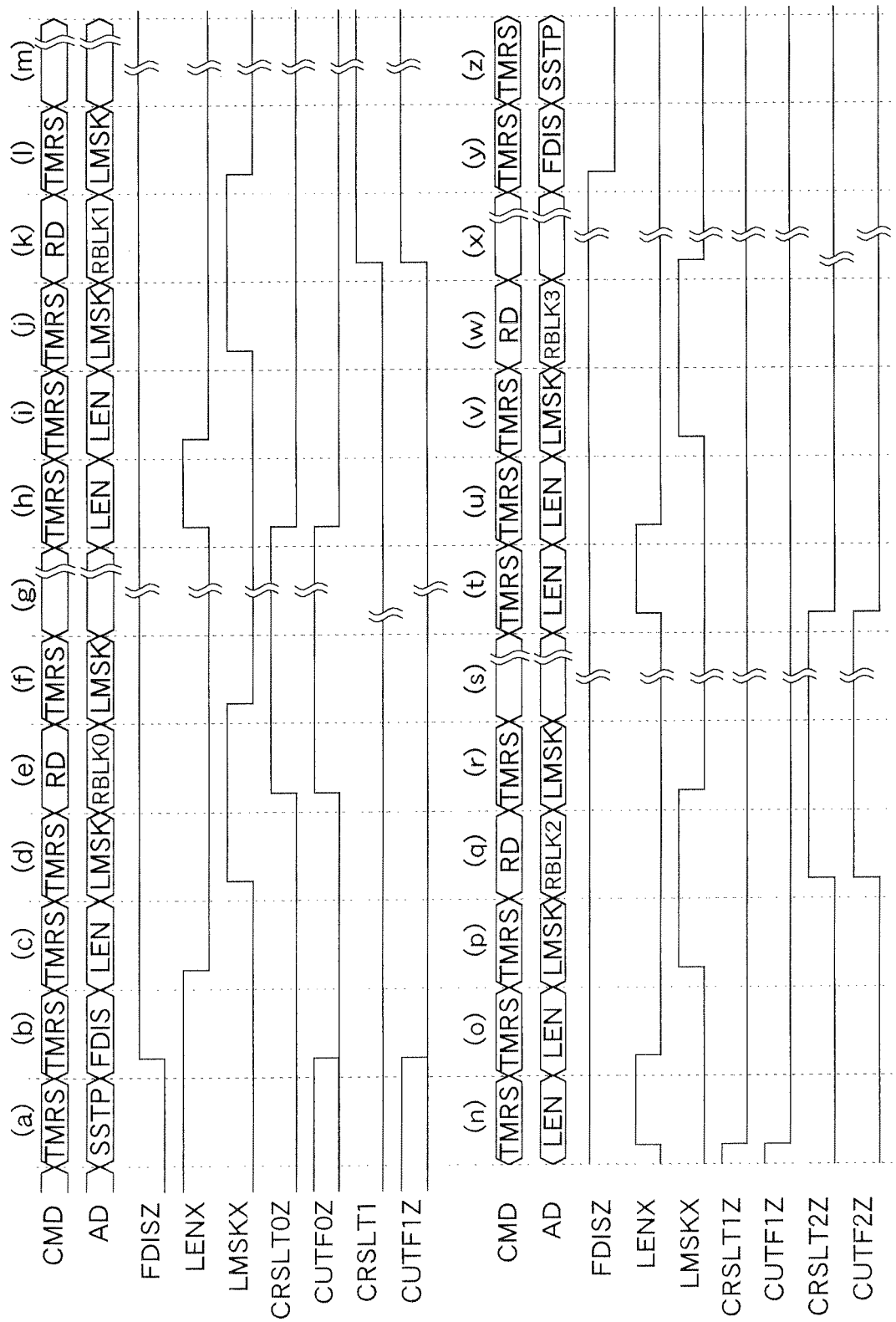
FIG. 16 is a timing chart illustrating an operation in the test mode in the first embodiment.

The test control circuit 14 outputs a fuse disable signal FDISZ, a latch enable signal LENX and a latch mask signal LMSKX which have the logic levels of the cross set signals CRS1Z, CRS2Z, CRS3Z, respectively. Details of the fuse disable signal FDISZ, the latch enable signal LENX and the latch mask signal LMSKX are illustrated in FIG. 5 and FIG. 16.

The core control circuit 16 changes a refresh signal REFZ to a high logic level when a refresh operation is performed, and changes the refresh signal REFZ to a low logic level when not performing the refresh operation. The core control circuit 16 has an arbiter ARB for determining the order of priority between the read command RD and the write command WR and a refresh request RREQ. For example, when receiving the refresh request RREQ a little earlier than a read command, the core control circuit 16 gives priority to the refresh request RREQ. The read operation in response to the read command RD is suspended until the refresh operation corresponding to the refresh request RREQ is completed. Conversely, when the refresh request RREQ is supplied during a read operation, the refresh operation in response to the refresh request RREQ is suspended temporarily. In response to the read command RD, the write command WR or the refresh request RREQ, the core control circuit 16 outputs control signals RASZ, SAE, and so on which control the access operation (read operation, write operation or refresh operation) of the memory core 32. The control signal RASZ is a basic timing signal indicating the start of the access operation. The control signal SAE is a timing signal for activating the sense amplifier SA. Further, the core control circuit 16 outputs a control signal which controls operations of the address buffer 24 and the data input/output buffer 26 according to an operation mode (for example, a burst length) set to the mode register which is not illustrated and set by mode register set command MRS.

The refresh timer 18 has an oscillator which outputs an oscillating signal OSC at a predetermined cycle. The refresh request generator 20 divides the frequency of the oscillating signal OSC to generate the refresh request RREQ (internal access request). The refresh request generator 20 stops generation of the refresh request RREQ when receiving a refresh disable signal REFDIS from the test mode register 12. Accordingly, the refresh operation is disabled. In other words, the refresh request generator 20 also operates as a refresh disable circuit which disables the refresh operation. The refresh address counter 22 sequentially generates a refresh address signal RRAD synchronously with the refresh request RREQ. The refresh address signal RRAD is a row address signal for selecting a word line WL, which will be described later.

The address buffer 24 receives simultaneously the row address signal RAD and the column address signal CAD supplied to address terminals AD (for example, AD0-22), and outputs the received address. Specifically, this memory MEM adopts an address non-multiplex method. The column address signal CAD is supplied for selecting a bit line pair BL, /BL, which will be described later. The data input/output buffer 26 receives a write data signal via a data terminal DQ (for example, DQ-15), and outputs the received data signal to a data bus DB. Further, the data input/output buffer 26 receives a read data signal from memory cells MC, which will be described later, via the data bus DB, and outputs the received data signal to the data terminal DQ.

The address selection circuit 28 selects the refresh address signal RRAD when performing a refresh operation (REFZ=high level) or selects the row address signal RAD when not performing a refresh operation (REFZ=low level), and outputs the selected signal to the memory core 32 as an internal row address signal IRAD.

Figure 8:
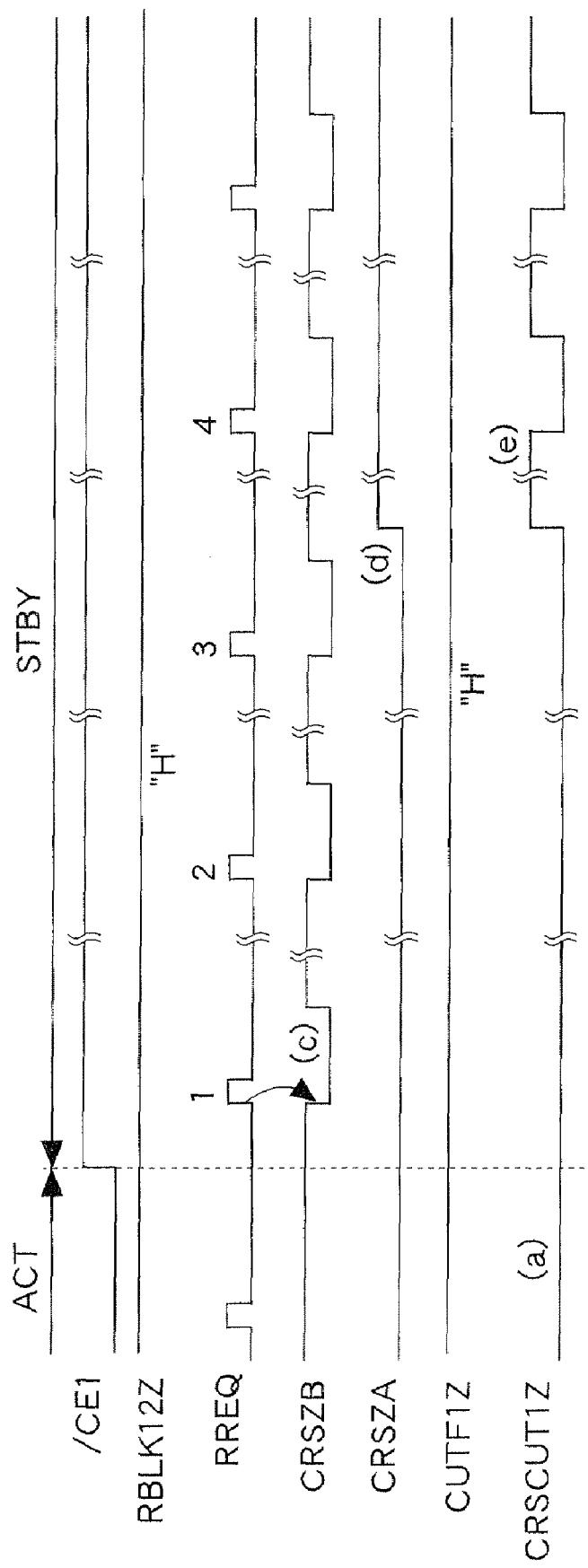
FIG. 8 is a timing chart illustrating operations of an internal mode control circuit illustrated in FIG. 1 and a cross control circuit illustrated in FIG. 7.

The internal mode control circuit 30 outputs a cross start control signal CRSZA (mode control signal) and a cross start control signal CRSZB for starting an operation for relieving a cross short failure (hereinafter also referred to as relief operation), which will be described later. As illustrated in FIG. 8, the internal mode control circuit 30 inactivates the cross start control signal CRSZA to a low level during an activation period ACT in which the chip enable signal /CE1 is held at a low logic level, and activates the cross start control signal CRSZA to a high level during a standby period STBY in which the chip enable signal /CE1 is held at a high logic level. The activation period ACT is a period in which a read operation and a write operation of memory cells MC are performed in response to the read command RD and the write command WR. The standby period STBY is a period in which a read operation and a write operation of memory cells MC are disabled, and only a refresh operation (self-refresh operation) is performed.

The internal mode control circuit 30 outputs the cross start control signal CRSZB according to the refresh request signal RREQ when the cross start control signal CRSZA is activated. However, the internal mode control circuit 30 holds the cross start control signal CRSZA to a low level when receiving the cross disable signal CRSDISZ (test signal) at a high level. Specifically, when the cross disable signal CRSDISZ is at a high level, the relief operation of cross short failure, which will be described later, is disabled. The cross disable signal CRSDISZ is set to a high level by setting a predetermined bit of the test mode register 12.

The memory core 32 has four row blocks RBLK (RBLK0-3; memory blocks), row decoders RDEC (RDEC0-3) and operation control circuits OPC (OPC0-3) corresponding to the row blocks RBLK0-3, sense amplifier areas SAA (SAA0, SAA01, SAA12, SAA23, SAA3), row control units RCNT (RCNT0, RCNT01, RCNT12, RCNT23, RCNT3) corresponding to the sense amplifier areas SAA, a column decoder CDEC, a read amplifier RA, and a write amplifier WA. A pair of sense amplifier areas SAA is arranged at opposite sides of a row block RBLK and an operation control circuit OPC. A pair of row control units RCNT is arranged at opposite sides of a row decoder RDEC. Note that the number of row blocks RBLK may be two, eight, ten, or the like.

Figure 3:
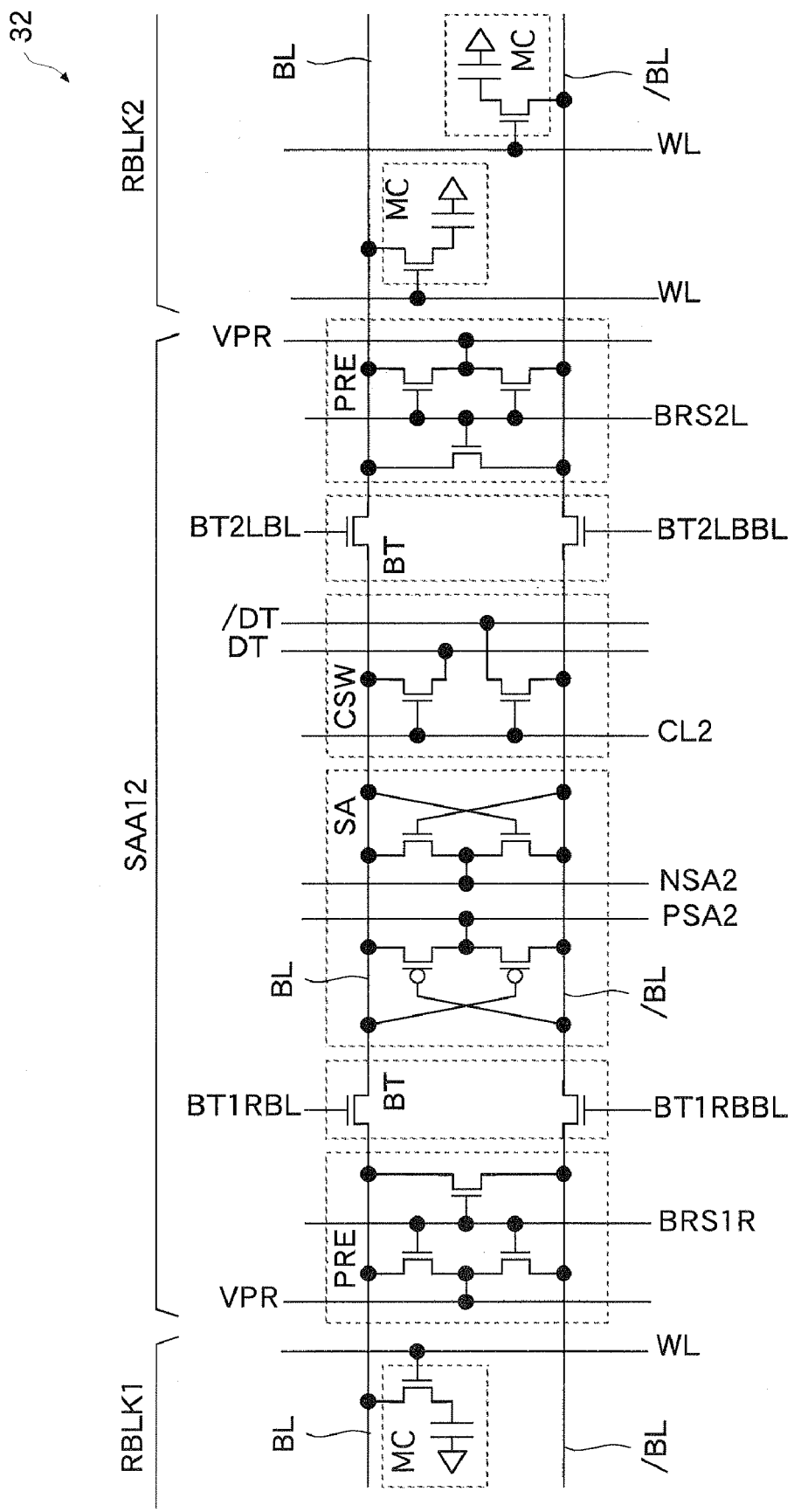
FIG. 3 is a circuit diagram illustrating details of an area shown by a dashed line in FIG. 2.
Figure 4:
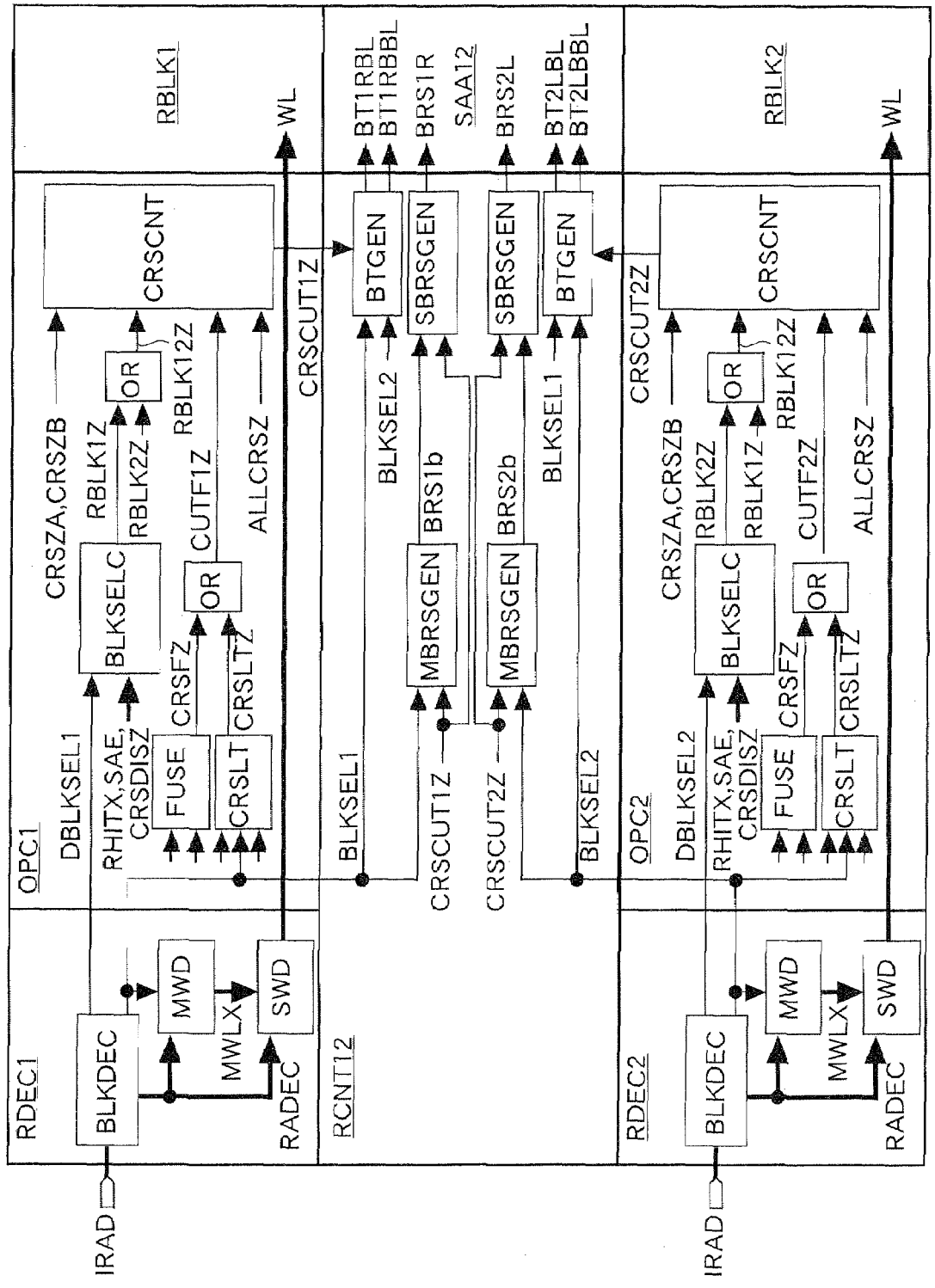
FIG. 4 is a block diagram illustrating details of a row decoder and a row control unit illustrated in FIG. 1.

The column address decoder CDEC decodes the column address signal CAD for selecting a number of bit line pairs BL, /BL corresponding to the number of bits of the data terminal DQ. The read amplifier RA amplifies complementary read data output via the column switch CSW upon a read access operation. The write amplifier WA amplifies complementary write data supplied via the data bus DB upon a write access operation, and supplies the amplified data to a bit line pair BL, /BL. Details of the row blocks RBLK, the row decoders RDEC, the operation control circuit OPC, the sense amplifier areas SAA and the row control units RCNT are illustrated in FIG. 2, FIG. 3, and FIG. 4.

Figure 2:
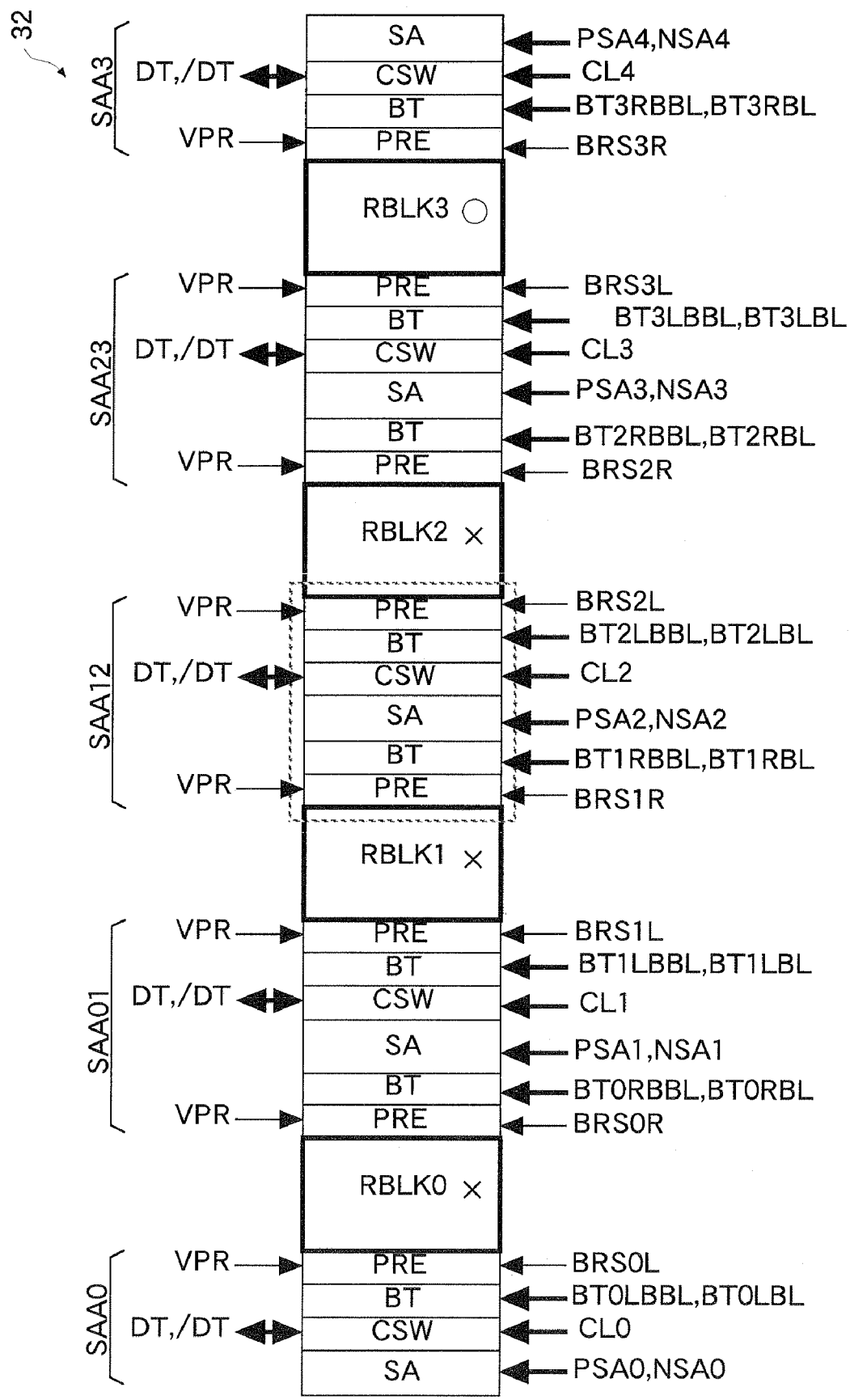
FIG. 2 is a block diagram illustrating an overview of a memory core illustrated in FIG. 1.

FIG. 2 illustrates an overview of the memory core 32 illustrated in FIG. 1. Each sense amplifier area SAA (block control circuit) has a precharge circuit PRE (precharge switch), a connection switch BT, a sense amplifier SA and a column switch CSW. The sense amplifiers SA of the sense amplifier areas SAA01, 12, 23 sandwiched by the row blocks RBLK are each shared by a pair of adjacent row blocks RBLK (for example, RBLK0-1) (shared sense amplifier method).

Each precharge circuit PRE couples a bit line pair BL, /BL to a precharge voltage line VPR (for example, 0.7 V) during a high level period of a precharge control signal BRS (BRS0L-BRS3L, BRS0R-BRS3R). A signal line for the precharge control signal BRS is wired in each block of the precharge circuits PRE.

Each connection switch BT operates synchronously with a switch control signal BT (BT0LBL-BT3LBL, BT0LBBL-BT3LBBL, BT0RBL-BT3RBL, BT0RBBL-BT3RBBL). The number of the switch control signal BT represents the number of the corresponding row block RBLK. The "BL" or "BBL" on the end of a switch control signal BT indicates that this switch control signal BT controls the connection switch BT coupled to a bit line BL or the connection switch BT coupled to a bit line /BL.

Each sense amplifier SA operates synchronously with sense amplifier activation signals PSA, NSA (PSA0-4, NSA0-4). The sense amplifier activation signals PSA, NSA are signals synchronous with the sense amplifier enable signal SAE output from the core control circuit 16 illustrated in FIG. 1. Signal lines for the sense amplifier activation signals PSA, NSA are wired in each block of the sense amplifiers SA. The sense amplifier SA amplifies the difference of signal amounts of data signals read to a bit line pair BL or /BL via the connection switch BT.

Each column switch CSW turns on during a high level period of a column switch signal CL (CL0-CL4), and couples complementary outputs (BL, /BL) of the sense amplifier SA to the read amplifier RA and the write amplifier WA via data lines DT, /DT. A signal line for the column switch signal CL is wired in each group of the column switches CSW corresponding to the number of bits of the data terminal DQ.

An X mark and a circle mark shown in each of the row blocks RBLK0-3 indicate whether there is a leak failure (cross short failure) between a word line WL and a bit line BL (or /BL). In this embodiment, for example, a cross short failure exists in the row blocks RBLK0, 1, 2 (bad memory blocks), and no cross short failure exists in the row block RBLK3 (good memory block).

FIG. 3 illustrates details of an area denoted by a broken line frame in FIG. 2. Other areas have the same structure of FIG. 3 except that a part of the signal name is different. Note that for convenience, in FIG. 3, data lines coupled to the bit lines BL, /BL via a coupling switch BT are also referred to as bit lines BL, /BL.

Each of the row blocks RBLK1-2 has a plurality of memory cells MC arranged in a matrix form, word lines WL each coupled to memory cells MC arranged in the vertical direction of the diagram, and bit lines BL, /BL coupled to memory cells MC arranged in the horizontal direction of the diagram. Each memory cell MC has a capacitor for retaining data as a charge, and a transfer transistor for coupling one end of this capacitor to the bit line BL (or /BL). The other end of the capacitor is coupled to a cell-plate voltage line VCP (not shown). A gate of the transfer transistor is coupled to the word line WL. By selecting the word line WL (activation to a high level), one of read operation, write operation, and refresh operation is performed. The memory cells MC coupled to the word line WL is coupled to one of the bit lines BL, /BL. Accordingly, when accessing the memory cell MC coupled to the bit line BL for example, the bit line /BL functions as a reference voltage line (precharge voltage VPR).

Each coupling switch BT is formed by an nMOS transistor (switch). One of source/drain of the nMOS transistor is coupled to the bit line BL (or /BL), and the other of the source/drain of the nMOS transistor is coupled to the sense amplifier SA. A gate of the nMOS transistor receives a switch control signal BT (BT1RBL, BT1RBBL, BT2LBL, BT2LBBL). The coupling switch BT couples the bit lines BL, /BL of the row block RBLK to the sense amplifier SA while receiving the switch control signal BT at a high level. In this embodiment, a pair of coupling switches BT coupled to the bit lines BL, /BL operate independently from each other.

Each precharge circuit PRE is formed by a pair of nMOS transistors for coupling a complementary bit lines BL, /BL to the precharge voltage line VPR and an nMOS transistor for coupling the bit lines BL, /BL with each other. A gate of the nMOS transistor of the precharge circuit PRE receives a precharge control signal BRS (BRS1R, BRS2L). The precharge circuit PRE supplies the precharge voltage VPR to the bit lines BL, /BL and also equalizes voltages of the bit lines BL, /BL while receiving the precharge control signal BRS at a high level.

The sense amplifier SA is arranged in common for a pair of the row blocks RBLK1-2. The sense amplifier SA is formed by a pair of CMOS inverters having inputs and outputs coupled to each other. The input of each CMOS inverter (gates of the transistors) is coupled to the bit line BL (or /BL). Each CMOS inverter is formed by an nMOS transistor and a pMOS transistor arranged in the horizontal direction of the diagram. A source of the pMOS transistor of each CMOS inverter receives a sense amplifier activation signal PSA (PSA2). A source of the nMOS transistor of each CMOS inverter receives a sense amplifier activation signal NSA (NSA2). The sense amplifier activation signal PSA is set to a high level (an internal power supply voltage VII; 1.6V for example) when the sense amplifier SA operates, and set to the precharge voltage VPR when the sense amplifier SA does not operate. The sense amplifier activation signal NSA is set to a low level (ground voltage VSS for example) when the sense amplifier SA operates, and set to the precharge voltage VPR when the sense amplifier SA does not operate.

The column switch CSW is formed by an nMOS transistor coupling the bit line BL to a data line DT and an nMOS transistor coupling the bit line /BL to a data line /DT. A gate of each nMOS transistor receives a column switch signal CL (CL2). Upon a read operation, read data signals on the bit lines BL, /BL amplified by the sense amplifier SA are transmitted to the data lines DT, /DT via the column switch CSW. Upon a write operation, write data signals supplied via the data lines DT, /DT are written to the memory cell MC via the bit lines BL, /BL.

FIG. 4 illustrates details of the row decoders RDEC1-2, the operation control circuits OPC1-2 and the row control unit RCNT12 illustrated in FIG. 1. The row decoders RDEC0, RDEC3, the operation control circuits OPC0, OPC3 and the row control units RCNT01, RCNT13 have same structures as the row decoders RDEC1-2, the operation control circuits OPC1-2 and the row control unit RCNT12 except that part of signal line names are different. The row control units RCNT0,3 are formed by a half of FIG. 4. Since the row decoders RDEC1-2 are the same circuits as each other, only the row decoder RDEC1 will be explained. Since the operation control circuits OPC1-2 are the same circuits as each other, only the operation control circuit OPC1 will be explained.

The row decoder RDEC1 is arranged adjacent to the corresponding row block RBLK1, and has a block decoder BLKDEC, a main word decoder MWD and a sub-word decoder SWD. The block decoder BLKDEC activates block selection signals DBLKSEL1, BLKSEL1 to a high level when higher order bits (block address) of the internal row address signal IRAD indicate the row block RBLK1. Further, the block decoder BLKDEC decodes lower order bits of the internal row address signal IRAD and outputs a row address decoded signal RADEC.

The main word decoder MWD activates one of main word lines MWLX to a low level according to the block selection signal BLKSEL1 and the row address decoded signal RADEC. The sub-word decoder SWD is formed for each of the main word lines MWLX. The sub-word decoder SWD receiving a main word line MWLX activated to a low level activates one of a plurality of word line WL (sub-word line) to a high level according to lower order bits of the row address decoded signal RADEC. For example, the high level of a word line WL is a boosted voltage VPP, and the low level of a word line WL is a negative voltage VNN (for example, −0.35 V).

The operation control circuit OPC1 is arranged adjacent to the corresponding row block RBLK1, and has a fuse circuit FUSE (program circuit), a cross latch circuit CRSLT (specification changing circuit), a block selection circuit BLKSELC, two OR circuits OR and a cross control circuit CRSCNT. The fuse circuit FUSE outputs a cross fuse signal CRSFSZ (operating specification signal) according to a program state of a fuse (FS in FIG. 5) included therein. When the cross fuse signal CRSFSZ is at a high level, a circuit for relieving a cross short failure operates. The cross latch circuit CRSLT operates during the test mode and sets a cross latch signal CRSLTZ to a high level in response to the block selection signal BLKSEL1. When the cross latch signal CRSLTZ is at a high level, a circuit for relieving a cross short failure operates. Details of the fuse circuit FUSE and the cross latch circuit CRSLT will be explained with FIG. 5. The OR logic of the cross fuse signal CRSFSZ and the cross latch signal CRSLTZ is output as a cut fuse signal CUTF1Z.

The block selection circuit BLKSELC latches the block selection signal DBLKSEL1 or a row redundancy hit signal RHITX (RHIT0X, RHIT1X) synchronously with the sense amplifier enable signal SAE, and outputs the latched value as a row block signal RBLK1Z. Details of the block selection circuit BLKSELC will be explained with FIG. 6.

The cross control circuit CRSCNT receives a block selection signal BLKSEL12Z as the OR logic of block selection signals BLKSEL1Z and BLKSEL2Z. The cross control circuit CRSCNT outputs a cross cut signal CRSCUT1Z synchronously with the cross start control signal CRSZB when the cut fuse signal CUTF1Z is at a high level or when an all cross signal ALLCRSZ (test signal) is at a high level. The all cross signal ALLCRSZ is set to a high level by setting a predetermined bit of the test mode register 12. When the all cross signal ALLCRSZ is set to a high level, regardless of setting states of the fuse circuit FUSE and the cross latch circuit CRSLT, the relief operation of cross short failure is implemented in all the row blocks RBLK0-3. Details of the cross control circuit CRSCNT will be explained with FIG. 7.

By arranging the fuse circuit FUSE, the cross latch circuit CRSLT and the cross control circuit CRSCNT adjacent to the corresponding row block RBLK1, wiring lengths of a cross fuse signal line CRSFSZ, a cross latch signal line CRSLTZ, a cut fuse signal line CUTF1Z and a cross cut signal line CRSCUT1Z can be made shorter. Particularly, since it is unnecessary to wire a signal line controlling the relief operation of cross short failure from the outside of the memory core 32, the wiring regions of such a signal line can be minimized, and hence increase in chip size of the memory MEM can be prevented.

The row control unit RCNT12 (timing control circuit) is arranged adjacent to the corresponding sense amplifier area SAA12, and has a pair of BT generator BTGEN (switch generator) which respectively generate switch control signals BT1RBL, BL1RBBL and switch control signals BT2LBL, BT2LBBL, a main BRS generator MBRSGEN (precharge generator) and a sub-BRS generator SBSGEN (precharge generator) which generate a precharge control signal BRS1R, a main BRS generator MBRSGEN and a sub-BRS generator SBSGEN which generate a precharge control signal BRS2L.

Figure 9:
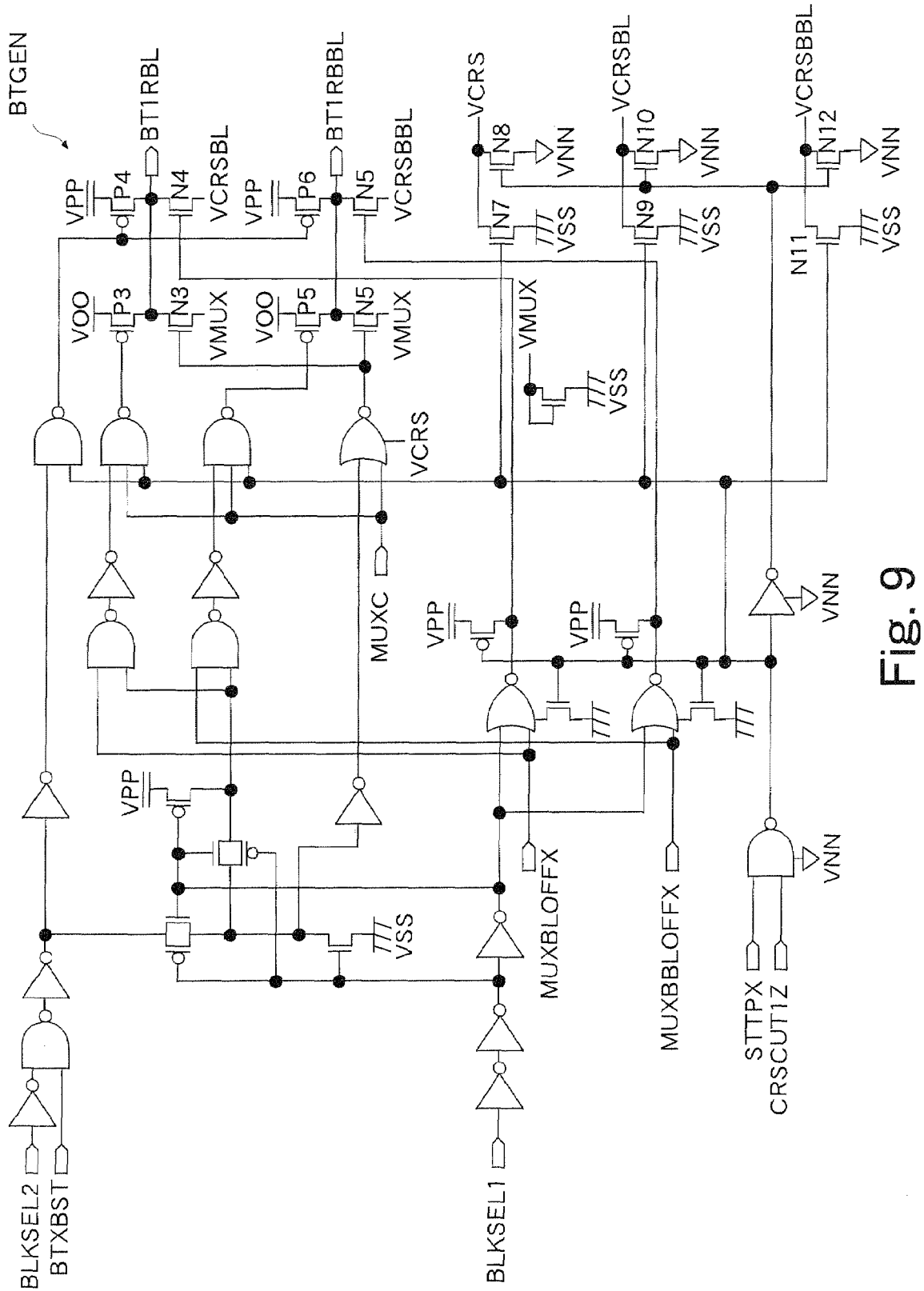
FIG. 9 is a circuit diagram illustrating details of a BT generator illustrated in FIG. 4.
Figure 10:
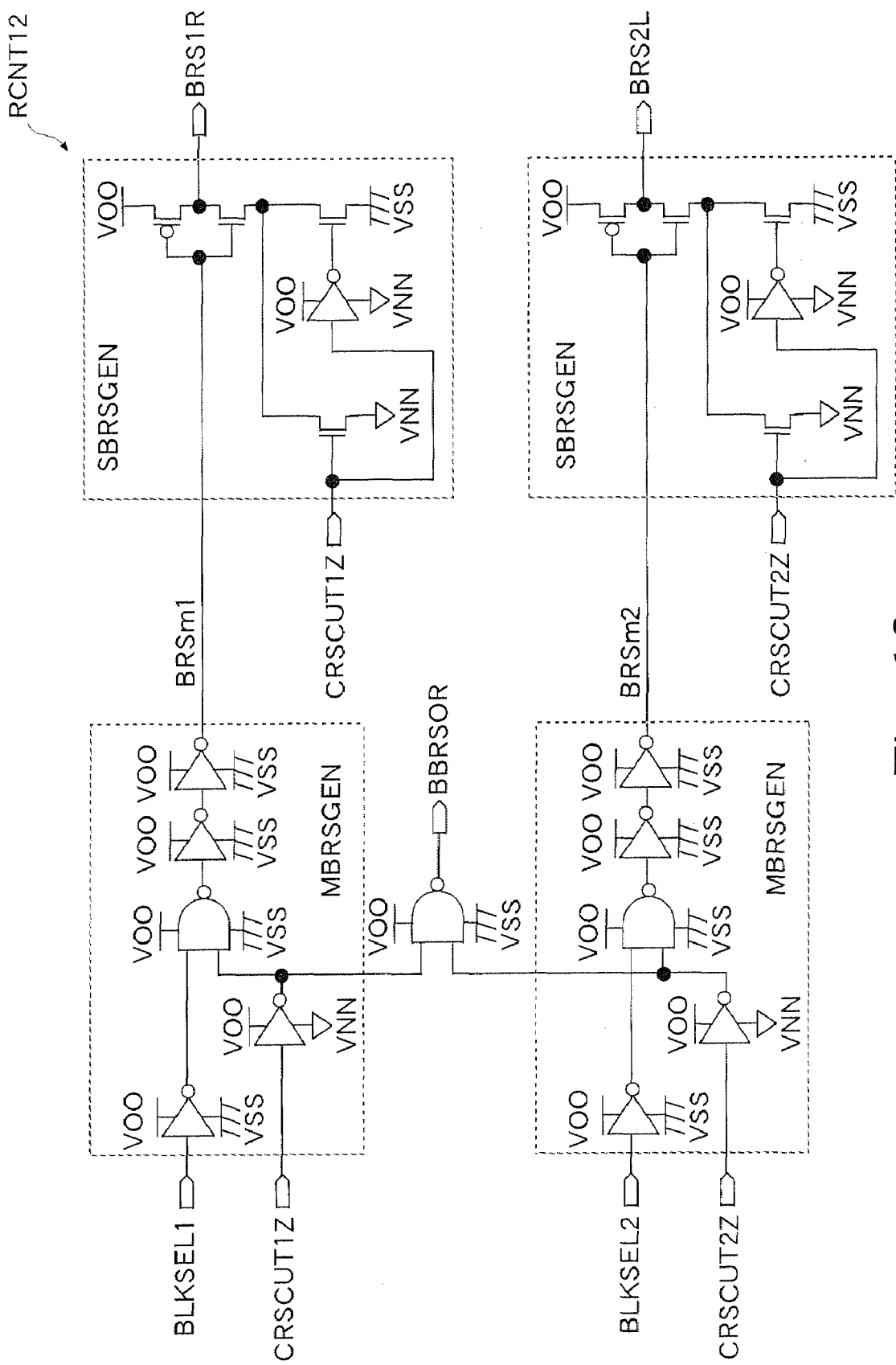
FIG. 10 is a circuit diagram illustrating details of a main BRS generator and a sub-BRS generator illustrated in FIG. 4.

Details of the BT generator BTGEN are illustrated in FIG. 9. Details of the main BRS generator MBRSGEN and the sub-BRS generator SBSGEN are illustrated in FIG. 10.

FIG. 5 illustrates details of the fuse circuit FUSE (program circuit) and the cross latch circuit CRSLT (specification changing circuit) illustrated in FIG. 4. In the diagram, the fuse circuit FUSE and the cross latch circuit CRSLT which correspond to the row block circuit RBLK1 are illustrated. Fuse circuits FUSE and cross latch circuits CRSLT for other row blocks RBLK are the same as in FIG. 5 except that part of signal line names are different.

The fuse circuit FUSE has a CMOS inverter arranged in series between an internal power supply line V11 and a ground line VSS, a fuse FS (non-volatile program unit) coupled to a source of an nMOS transistor of the CMOS inverter, a latch LT1 coupled to an output of the CMOS inverter, and a NOR gate which receives an output of the latch LT1 and the fuse disable signal FDISZ and outputs a cross fuse signal CRSFZ. The fuse circuit FUSE latches a logic level according to a program state of the fuse FS in the latch LT1 synchronously with a starter signal STTZ which changes temporarily to a high level when the memory MEM is powered on. When the fuse FS is cut (programmed), the cross fuse signal CRSFZ at a high level is output (second operating specification). When the fuse FS is uncut (non-programmed), the cross fuse signal CRSFZ at a low level is output (first operating specification).

The second operating specification is, as will be described later, an operating specification to implement the relief operation of cross short failure, and the first operating specification is an operating specification not to implement the relief operation of cross short failure. However, when the fuse disable signal FDISZ is set to a high level by setting of the test mode register 12 during the test mode, the cross fuse signal CRSFZ is held at a low level. Specifically, the NOR gate operates as a mask circuit to mask the cross fuse signal CRSFZ which is output according to a state of the fuse FS. Accordingly, as will be described later, regardless of the program state of the fuse circuit FUSE, the cut fuse signal CUTF1Z can be generated according to the cross latch circuit CRSLT. The fuse disable signal FDISZ is supplied commonly to all the fuse circuits FUSE corresponding to the row blocks RBLK0-3.

The cross latch circuit CRSLT has a pMOS transistor P1 (reset circuit), an nMOS transistor N1 and an nMOS transistor N2 (mask circuit) arranged in series between the internal power supply line V11 and the ground line VSS, and a latch LT2 coupled to a drain of the pMOS transistor P1. A gate of the transistor P1 turns on when the latch enable signal LENX supplied during the test mode is at a high level. The transistor N1 turns on when the block selection signal BLKSEL1 is at a high level. The transistor N2 turns on when the latch mask signal LMSKX supplied during the test mode is at a high level, and couples a source of the transistor N1 to the ground line VSS. The transistor N2 turns off when the latch mask signal LMSKX is at a low level, and sets the source of the transistor N1 to floating. Thus, acceptance of the block selection signal BLKSEL1 is disabled.

The latch LT2 is activated when the latch enable signal LENX is at a low level, latches an input level (level of the drain of the transistor P1), and outputs an inverted level of the latched value as the cross latch signal CRSLTZ. The input level changes from a high level to a low level in response to activation of the block selection signal BLKSEL1. The latch LT2 is reset when the latch enable signal LENX is at a high level, and resets the cross latch signal CRSLTZ to a low level. The latch enable signal LENX and the latch mask signal LMSKX are supplied commonly to all the cross latch circuits CRSLT corresponding to the row blocks RBLK0-3. Thus, the cross latch circuit CRSLT (latch LT2) is set in response to activation of the corresponding block selection signal BLKSEL1 during the test mode, activates the cross latch signal CRSLTZ to a high level while being set (second operating specification), and inactivates the cross latch signal CRSLTZ indicating the first operating specification to a low level when not being set (first operating specification).

During a normal operation mode, the latch enable signal LENX is held at a high level, and the cross latch signal CRSLTZ is held at a low level. In the test mode, when the block selection signal BLKSEL1 is activated to a high level after the latch enable signal LENX and the latch mask signal LMSKX is set to a low level and a high level respectively, the logic level latched by the latch LT2 is inverted, and the cross latch signal CRSLTZ changes to a high level. Specifically, by accessing the row block RBLK1 in a pseudo manner during the test mode, the latch LT2 is set and the cross latch signal CRSLTZ changes to a high level. Thus, the relief operation of cross short failure can be implemented regardless of the program state of the fuse circuit FUSE.

Figure 13:
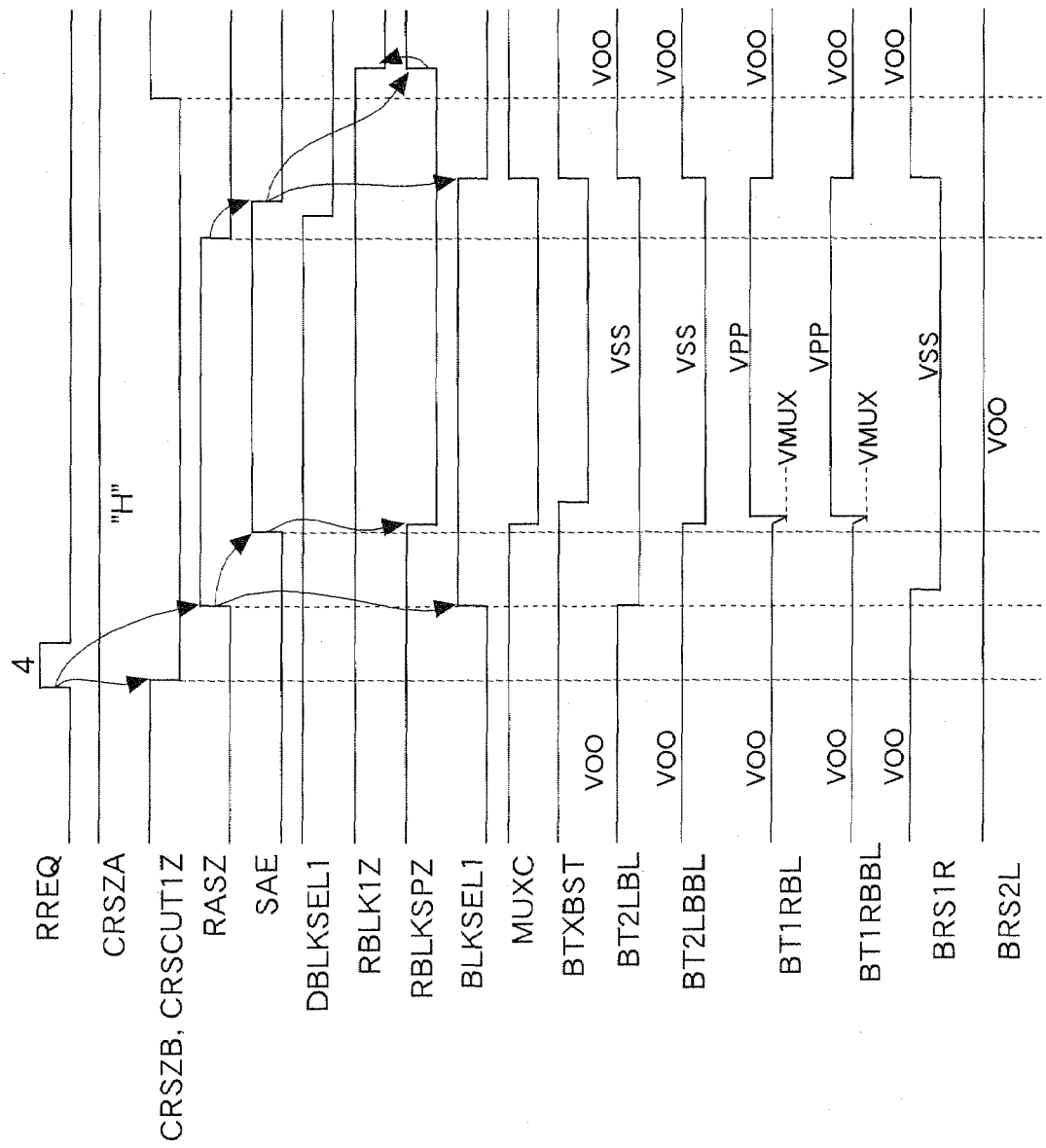
FIG. 13 is a timing chart illustrating an operation of a semiconductor memory of the first embodiment.

By accessing the row blocks RBLK0-3 in a pseudo manner during the test mode, the latch LT2 of the corresponding cross latch circuit CRSLT is set, and the cross latch signal CRSLTZ changes to a high level. However, when an access test or the like is implemented in this state and the block selection signal BLKSEL is activated, the latch LT that is not set is set, and the cross latch signal CRSLTZ changes to a high level. To prevent this, after the latch LT2 to be set is set, the latch mask signal LMSKX is set to a low level. Thereafter, it is possible to prevent the latch LT2 from being set by the block selection signal BLKSEL (BLKSEL1 in FIG. 5) by mistake. An operation of the cross latch circuit CRSLT is illustrated in FIG. 13.

As described above, by the Or-circuit OR, the cut fuse signal CUTF1Z is activated to a high level when either the cross fuse signal CRSFZ or the cross latch signal CRSLTZ is at a high level. By the cut fuse signal CUTFZ1 at a high level, the relief operation of cross short failure is implemented in the corresponding row block RBLK1.

Figure 6:
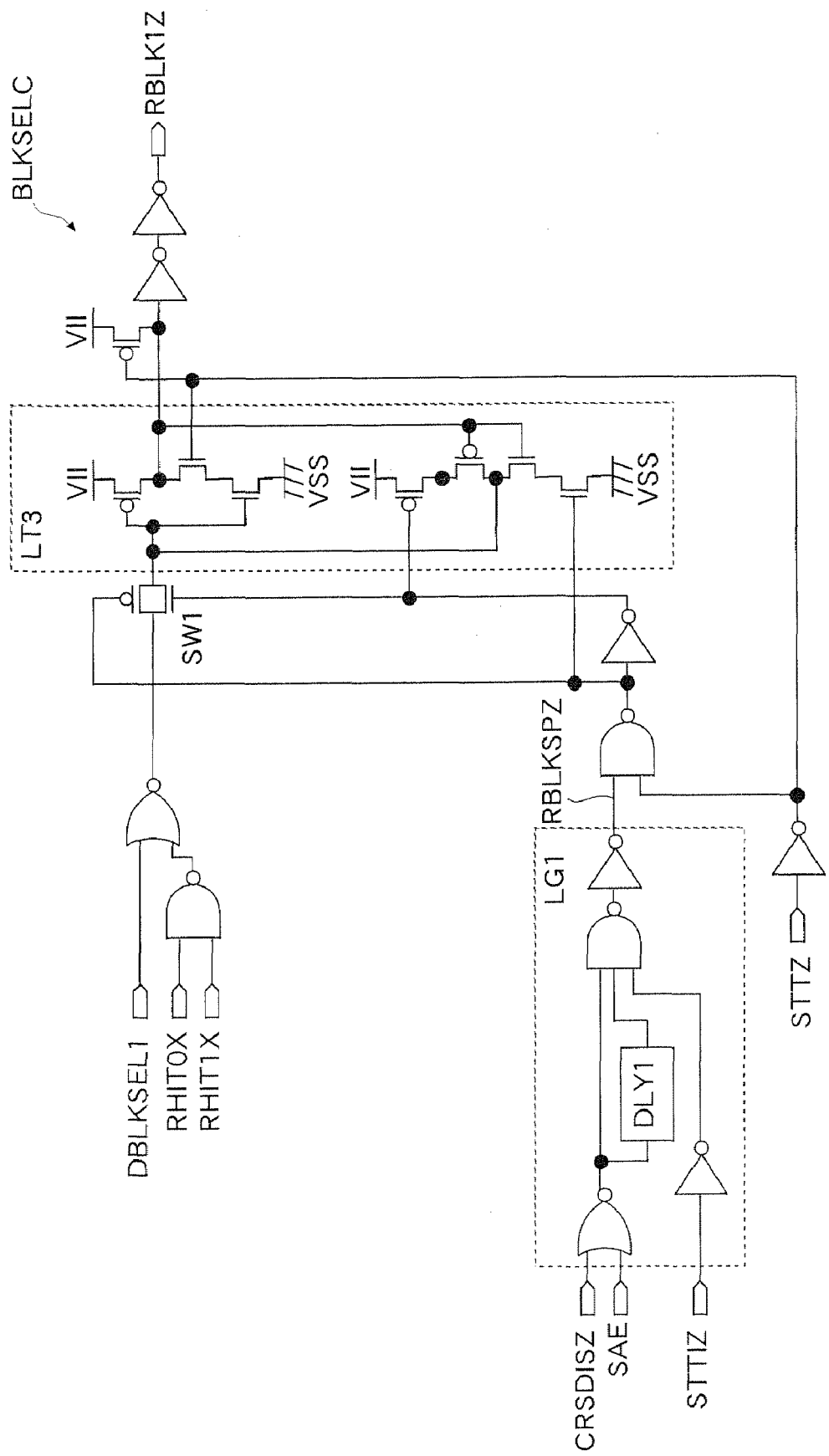
FIG. 6 is a circuit diagram illustrating details of a block selection circuit illustrated in FIG. 4.

FIG. 6 illustrates details of the block selection circuit BLKSELC illustrated in FIG. 4. In the diagram, the block selection circuit BLKSELC corresponding to the row block RBLK1 is illustrated. The block selection circuits BLKSELC corresponding to the other row blocks RBLK are the same as in FIG. 6 except that part of signal line names are different.

The block selection circuit BLKSELC has a latch LT3, a switch SW1 for supplying the block selection signal DBLKSEL1 or the row redundancy hit signals RHIT0X, RHIT1X to the latch LT3, and a logic circuit LG1 which controls operations of the latch LT3 and the switch SW1. The logic circuit LG1 outputs a row block pulse signal RBLKSPZ having a negative pulse in response to a positive pulse of the sense amplifier enable signal SAE. A delay circuit DLY1 has a function to delay a falling edge of the sense amplifier enable signal SAE. Thus, a rising edge of the row block pulse signal RBLKSPZ is generated later than a falling edge of the sense amplifier enable signal SAE by the delay circuit DLY1.

The switch SW1 turns on when the row block pulse signal RBLKSPZ is at a high level. The latch LT3 operates as an inverter when the row block pulse signal RBLKSPZ is at a high level, and latches a logic level received synchronously with a falling edge of the row block pulse signal RBLKSPZ. Then the row block signal RBLK1Z is output from the output of the latch LT3.

The logic circuit LG1 sets the row block pulse signal RBLKSPZ to a low level when receiving the cross disable signal CRSDIS at a high level. At this time, the latch LT3 outputs the row block signal RBLK1Z according to an input level. The cross disable signal CRSDIS is set to a high level when disabling the relief operation of cross short failure in all the row blocks RBLK0-3. The relief operation of cross short failure is disabled by setting the cross start control signals CRSZA, CRSZB to a low level by the cross disable signal CRSDIS. Accordingly, no problem occurs even when the logic level of the row block signal RBLK1Z becomes indefinite by the cross disable signal CRSDIS at a high level. To initialize the latch LT3, the starter signals STTZ, STTIZ change temporarily to a high level when the memory MEM is powered on.

The row redundancy hit signals RHIT0X, RHIT1X are activated to a low level when a failure address of another row block RBLK is accessed by a redundancy fuse circuit and a redundancy control circuit, which are not illustrated. Specifically, for example, a redundancy word line of the row block RBLK1 is used for relieving word lines WL of the other row blocks RBLK0,2-3. Each of the row blocks RBLK0-3 has two redundancy word lines for relieving a failure in the other row blocks RBLK. The row redundancy hit signals RHIT0X, RHIT1X are activated respectively when the redundancy word lines of the corresponding row blocks RBLK are selected.

Figure 7:
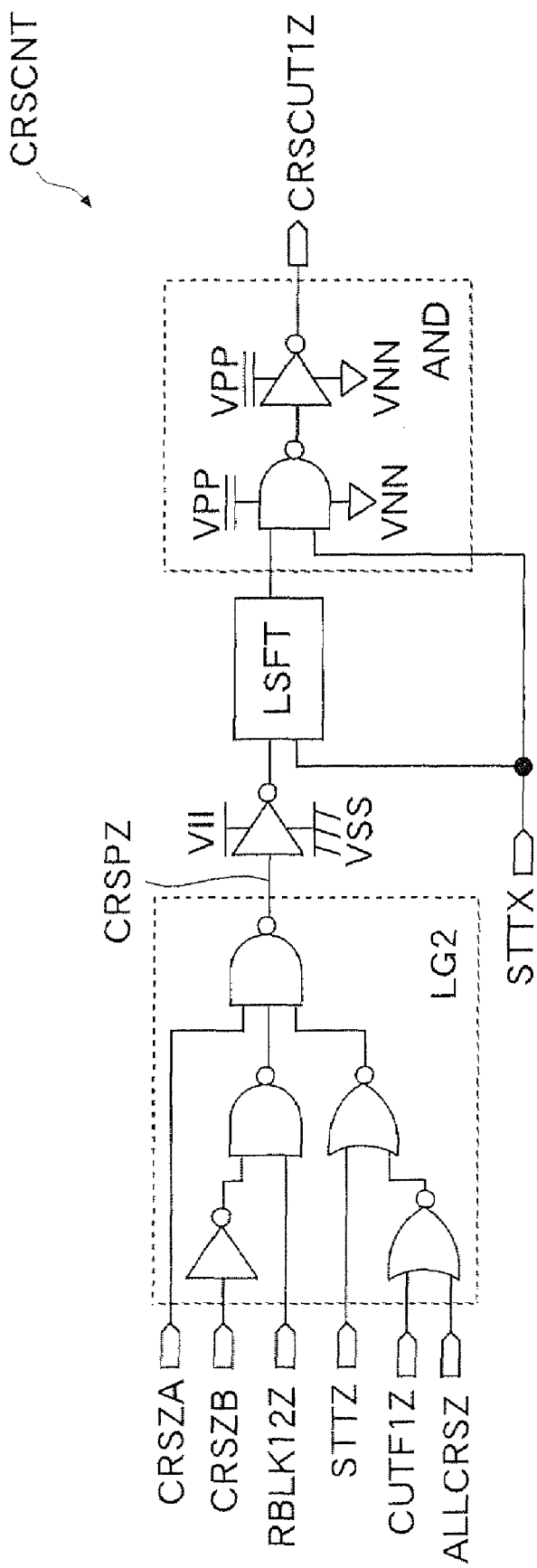
FIG. 7 is a circuit diagram illustrating details of a cross control circuit illustrated in FIG. 4.

FIG. 7 illustrates details of the cross control circuit CRSCNT (operation signal generator) illustrated in FIG. 4. In the diagram, the cross control circuit CRSCNT corresponding to the row block RBLK1 is illustrated. The cross control circuits CRSCNT corresponding to the other row blocks RBLK are the same as in FIG. 7 except that part of signal line names are different.

The cross control circuit CRSCNT has a logic circuit LG2, a level shifter LSFT and an and-circuit AND. The logic circuit LG2 outputs a positive pulse CRSPZ synchronously with a negative pulse of the cross start control signal CRSZB when the cross start control signal CRSZA is at a high level, the cut fuse signal CUTF1Z or the all cross signal ALLCRSZ is at a high level, and the row block signal RBLK12Z is at a high level. The level shifter LSFT converts the high level (VII) and the low level (VSS) of a signal output from the logic circuit LG2 to the booster voltage VPP and the negative voltage VNN, respectively. The and-circuit AND outputs the cross cut signal CRSCUT1Z inverting the logic level of the output signal CRSPZ from the logic circuit LG2. The cross cut signal CRSCUTZ (CRSCUT1Z-3Z) is supplied to the row control unit RCNT (RCNT12 or RCNT0, RCNT01, RCNT23, RCNT3) so as to change generation timings of the switch control signal BT (BT1RBL, BL1RBBL, BT2LBL, BT2LBBL in FIG. 9) and the precharge control signal BRS (BRS1R, BRS2L in FIG. 10). The starter signal STTX changes temporarily to a low level when the memory MEM is powered on.

FIG. 8 illustrates operations of the internal mode control circuit 30 illustrated in FIG. 1 and the cross control circuit CRSCNT illustrated in FIG. 7. FIG. 8 illustrates operations when the corresponding row block signal RBLK12Z is activated to a high level H. The cross control circuit CRSCNT outputs the cross cut signal CRSCUT1Z (operation control signal indicating the first operating mode) at a low level regardless of the level of the cut fuse signal CUTF1Z when the cross start control signal CRSZA (mode control signal) is inactivated to a low level (FIG. 8 (a)). The memory MEM changes from the active state ACT to the standby state STBY (self-refresh state) when the chip enable signal /CE1 is inactivated to a high level (FIG. 8 (b)).

The internal mode control circuit 30 sets the cross start control signal CRSZB to a low level for a predetermined period synchronously with the refresh request signal RREQ while the chip enable signal /CE1 is at a high level (FIG. 8 (c)). When the refresh request signal RREQ is received three times in the standby state STBY, the internal mode control circuit 30 sets the cross start control signal CRSZA to a high level (FIG. 8 (d)). Specifically, the cross start control signal CRSZA is activated when a predetermined time passes after switching from the activation period ACT to the standby period STBY.

When the system accessing the memory MEM sets the memory MEM to the standby period STBY temporarily and continues the access operation thereafter, it is not necessary to implement the relief operation of cross short failure. This is because when the activation period ACT in which the access operation is performed is dominant, the efficiency in reduction of current is relatively low even when the relief operation of cross short failure is implemented. Accordingly, when the standby period STBY is temporary, it is possible to prevent the circuit from operating for the relief operation, and the current consumption can be reduced. Note that the activation timing of the cross start control signal CRSZA is determined according to the specification of the system. For example, when the system always sets the standby period STBY for a long period, the activation timing of the cross start control signal CRSZA may also be just after switching to the standby period STBY.

Synchronously with the change of the cross start control signal CRSZA to the high level, the logic circuit LG2 of the cross control circuit CRSCNT illustrated in FIG. 7 turns to a state of being capable of changing the level of the output signal CRSPZ synchronously with the cross start control signal CRSZB. When the cut fuse signal CUTF1Z is activated to a high level ("H"), the cross control circuit CRSCNT outputs a cross cut signal CRSCUT1Z at a high level (operation control signal indicating the second operating specification) synchronously with the cross start control signal CRSZB (FIG. 8 (e)). Note that when the cut fuse signal CUTF1Z is inactivated, that is, the relief operation of cross short failure is not implemented, the cross cut signal CRSCUT1Z is held at a low level (operation control signal indicating the first operating specification).

FIG. 9 illustrates details of the BT generator BTGEN illustrated in FIG. 4. In the diagram, the BT generator BTGEN corresponding to the row block RBLK1 is illustrated. The BT generators BTGEN corresponding to the other row blocks RBLK are the same as in FIG. 9 except that part of signal line names are different. Among the logic gates in the diagram, a logic gate with power supply that is not clearly illustrated has the power supply coupled to the boosted power supply line VPP.

The block selection signal BLKSEL1 is a signal for a row block RBLK (RBLK1 in this example) in which the access operation is performed out of a pair of row blocks RBLK (RBLK1-2 in FIG. 4) adjacent to each other, which is illustrated in FIG. 4. The block selection signal BLKSEL2 is a signal for a row block RBLK (RBLK2 in this example) in which the access operation is not performed out of the pair of row blocks RBLK.

The BT generator BTGEN sets the switch control signals BTBL, BTBBL (for example, BT1RBL, BT1RBBL) to either high levels VOO, VPP or low levels VSS, VNN, VMUX according to the operation state. For example, the voltage VOO is 2 V, the voltage VPP is 2.8 V, the voltage VSS is 0 V, the voltage VNN is −0.35 V, and the voltage VMUX is 0.7 V. The voltage VPP is generated by a boosting circuit, which is not illustrated, using an external power supply voltage VDD (1.8 V for example). The voltage VNN is generated by a negative voltage generator, which is not illustrated, using the external power supply voltage VDD. The voltage VMUX is generated by a diode-coupled nMOS transistor.

The switch control signal BT1RBL is set to the voltage VOO, VPP, VMUX or VCRSBL by turning on of either the pMOS transistors P3, P4 or the nMOS transistors N3, N4. The switch control signal BT1RBBL is set to the voltage VOO, VPP, VMUX or VCRSBBL by turning on of either the pMOS transistors P5, P6 or the nMOS transistors N5, N6. The voltages VCRSBL, VCRSBBL are set to one of the voltages VSS, VNN by the nMOS transistors N9-N12. The voltage VCRS is set to one of the voltages VSS, VNN by the nMOS transistors N7-8.

The control signal MUXC changes to a low level when the switch control signals BTBL, BTBBL (for example, BT1RBL, BT1RBBL) corresponding to the row block RBLK (for example, RBLK1) in which the access operation is performed is set to the low level VMUX. The control signal BTXBST changes to a low level when the switch control signals BTBL, BTBBL (for example, BT1RBL, BT1RBBL) corresponding to the row block RBLK (for example, RBLK1) in which the access operation is performed is set to the high level VPP. The control signals MUXBLOFFX, MUXB-BLOFFX change to a low level when the switch control signals BTBL, BTBBL (for example, BT2LBL, BT2LBBL) corresponding to the row block RBLK (for example, RBLK2) in which the access operation is not performed is set to the low level VSS. The starter signal STTPX changes temporarily to a low level when the memory MEM is powered on. Details of an operation of the BT generator BTGEN will be explained with FIG. 12.

FIG. 10 illustrates details of the main BRS generator MBRSGEN and the sub-BRS generator SBSGEN illustrated in FIG. 4. In the diagram, the BRS generators MBRSGEN, SBSGEN corresponding to the sense amplifier area SAA12 shared by the row blocks RBLK1-2 are illustrated. The BRS generators MBRSGEN, SBSGEN corresponding to the other sense amplifier areas SAA are the same as in FIG. 10 except that part of signal line names are different.

The main BRS generator MBRSGEN is an OR circuit, and outputs a precharge control signal BRSm (BRSm1 or BRSm2) at a high level when at least one of the block selection signal BLKSEL1 (or BLKSEL2) and the cross cut signal CRSCUT1Z (or CRSCUT2Z) is at a high level.

The sub-BRS generator SBSGEN inverts the logic of the precharge control signal BRSm (BRSm1 or BRSm2) and outputs as the precharge control signal BRS (BRS1R or BRS2L). However, when the cross cut signal CRSCUT1Z (or CRSCUT2Z) is at a high level, the low level of the precharge control signal BRS1R (or BRS2L) is set to the negative voltage VNN. When the cross cut signal CRSCUT1Z (or CRSCUT2Z) is at a low level, the low level of the precharge control signal BRS1R (or BRS2L) is set to the ground voltage VSS. Note that an OR signal BBRSOR that is the OR logic of the cross cut signals CRSCUT1Z, CRSCUT2Z is used for setting the sense amplifier activation signals PSA, NSA illustrated in FIG. 2 to the precharge voltage VPR when the sense amplifier SA is not operating.

Figure 11:
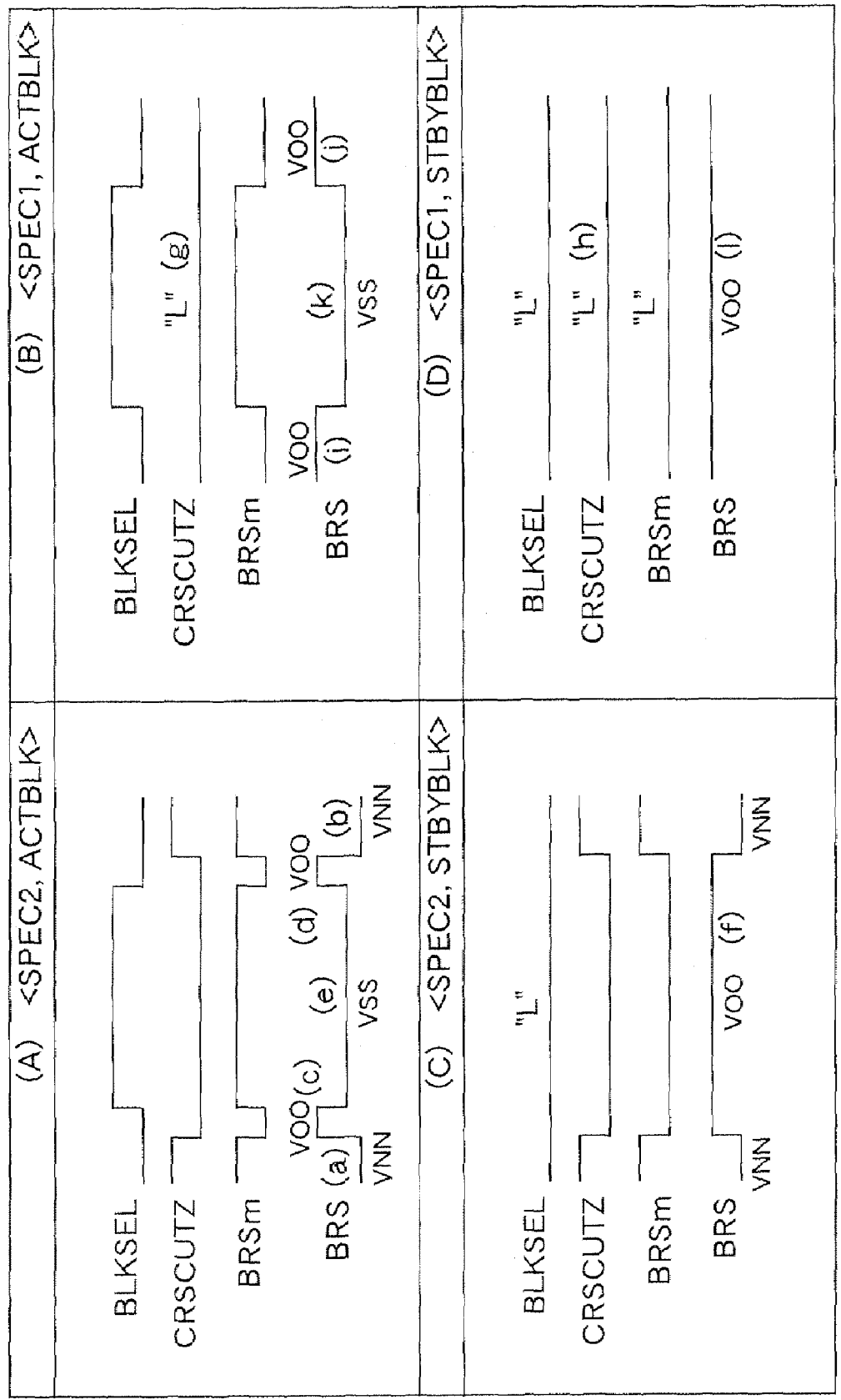
FIG. 11 is a timing chart illustrating operations of the main BRS generator and the sub-BRS generator illustrated in FIG. 10.

FIG. 11 illustrates operations of the main BRS generator MBRSGEN and the sub-BRS generator SBSGEN illustrated in FIG. 10. Waveforms (A), (C) represent operations of the circuits MBRSGEN, SBSGEN corresponding to the row block RBLK in which a cross short failure is relieved (second operating specification SPEC2). Waveforms (B), (D) represent operations of the circuits MBRSGEN, SBSGEN corresponding to the row block RBLK having no cross short failure (first operating specification SPEC1). Further, waveforms (A), (B) represent operations of the circuits MBRSGEN, SBSGEN corresponding to a row block (ACTBLK) in which the access operation is performed. Waveforms (C), (D) represent operations of the circuits MBRSGEN, SBSGEN corresponding to a row block (STBYBLK) in which the access operation is not performed.

As illustrated in FIG. 10, the precharge control signal BRSm (BRSm1 or BRSm2) change to a high level when one of the block selection signal BLKSEL (BLKSEL1 or BLKSEL2) or the cross cut signal CRSCUTZ (CRSCUT1Z or CRSCUT2Z) is at a high level. The precharge control signal BRS (for example, BRS1R or BRS2L) is a signal inverting the logic of the precharge control signal BRSm. A high level period of the block selection signal BLKSEL is a period in which the access operation is performed.

In the row block RBLK in which a cross short failure is relieved (operates with the second operating specification SPEC2), the precharge control signal BRS is set to the negative voltage VNN before and after the access operation (period in which the memory cells MC are not accessed) (FIG. 11 (a, b)). The nMOS transistor of the precharge circuit PRE illustrated in FIG. 3 turns off, and the bit lines BL, /BL are cut off from the precharge voltage line VPR and set to a floating state. Accordingly, even when there is a leak failure (cross short failure) between a word line WL and a bit line BL (or /BL), the leak current does not flow. That is, the relief operation of cross short failure is performed.

Further, immediately before and after the access operation (before and after an activation period of the word line WL), the precharge control signal BRS changes to a high level (FIG. 11 (c, d)). Accordingly, the nMOS transistor of the precharge circuit PRE turns on, and the bit lines BL, /BL are precharged to the precharge voltage VPR. During the access operation (during activation of the word line WL), the precharge control signal BRS is set to the ground voltage VSS (FIG. 11 (e)). In this period, the precharge circuit PRE turns off, and the bit lines BL, /BL change to a voltage depending on the charge read from a memory cell MC or a voltage amplified by the sense amplifier SA.

When the row block RBLK (RBLK2) that forms a pair with the row block RBLK (for example, RBLK1) in which a cross short failure is relieved is accessed, the precharge control signal BRS corresponding to the row block RBLK1 is set to a high level VOO during the access period (FIG. 11 (f)). Specifically, the bit lines BL, /BL are set to the precharge voltage VPR during a period in which the adjacent row block RBLK2 is accessed.

On the other hand, the row block RBLK in which there is no cross short failure (specifically, the row block RBLK operating with the first operating specification SPEC1 in which a cross short failure is not relieved), the cross cut signal CRSCUTZ is always held at a low level "L" (FIG. 11 (g, h)). Accordingly, in the row block RBLK in which the access operation is performed, the precharge control signal BRS is set to a high level VOO during a period in which the memory cells MC are not accessed (FIG. 11 (i, j)), and is set to the ground voltage VSS during a period in which the memory cells MC are accessed (FIG. 11 (k)). In the row block RBLK in which the access operation is not performed, the precharge control signal BRS is always set to a high level VOO (FIG. 11 (l)). When the precharge control signal BRS is at the high level VOO, the bit lines BL, /BL are coupled to the precharge voltage line VPR. Thus, the main BRS generator MBRSGEN and the sub-BRS generator SBSGEN change the output timing of the precharge control signal BRS according to the cross cut signal CRSCUT1Z (operating specification signal) from the fuse circuit FUSE or the cross latch circuit CRSLT.

Figure 12:
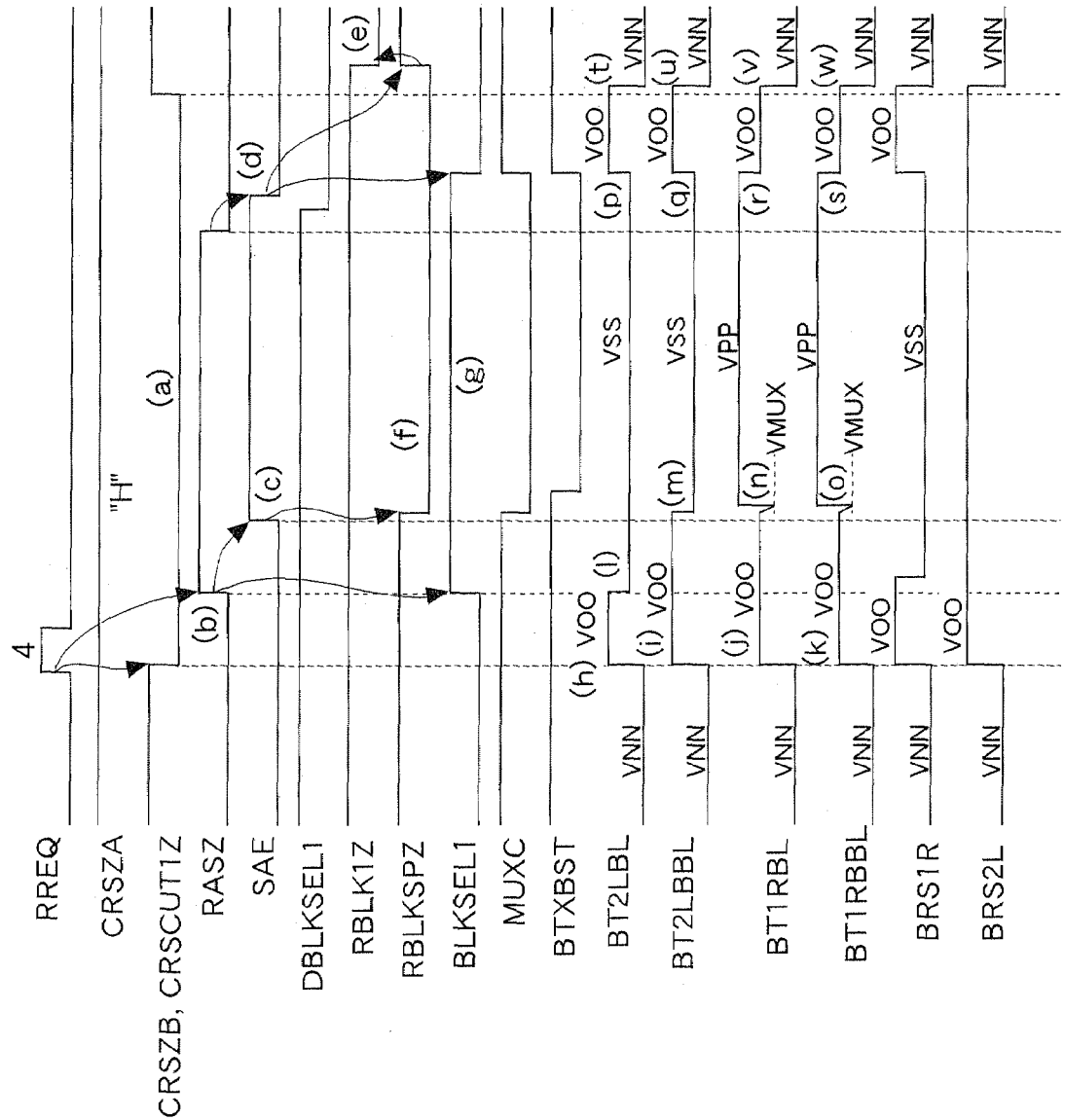
FIG. 12 is a timing chart illustrating an operation of the row control unit illustrated in FIG. 4.

FIG. 12 illustrates an operation of the row control unit RCNT12 illustrated in FIG. 4. Note that operations of the other row control units RCNT are the same as in FIG. 12 except that part of signal line names are different. This operation shows a state that the fuse FS in FIG. 5 is cut, or a state that the latch LT2 of the cross latch circuit CRSLT in FIG. 5 is set (the CRSLTZ signal is at a high level) during the test mode (second operating specification). In the test mode, by the cross latch circuit CRSLT, it is possible to set a state that the fuse FS is cut in a pseudo-manner before the fuse FS is cut.

In this example, the access operation (self-refresh operation) is performed in the row block RBLK1 in which a cross short failure is relieved. The memory cell MC to be refreshed is coupled to the bit line BL, and the bit line /BL functions as a reference voltage line. The self-refresh operation is a refresh operation performed automatically inside the memory MEM during the standby period STBY. Accordingly, the standby period STBY is also referred to as a self-refresh period. The "4" shown on the refresh request signal RREQ indicates that it is the fourth refresh request signal RREQ after switching to the standby period STBY, as illustrated in FIG. 8. Specifically, FIG. 12 illustrates a state that the relief operation of cross short failure is implemented. Note that waveforms of the precharge control signals BRS1R, BRS2L are the same as the waveforms (A), (C) in FIG. 11, and hence explanations thereof are omitted.

As illustrated in FIG. 8, the cross start control signal CRSZB and the cross cut signal CRSCUT1Z change to a low level synchronously with the refresh request signal RREQ for a predetermined period (FIG. 12 (a)). The basic timing signal RASZ changes also to a high level synchronously with the refresh request signal RREQ for a predetermined period (FIG. 12 (b)). The high level period of the basic timing signal RASZ is an activation period of a word line WL, and is a period in which a storage node (capacitor) of a memory cell MC is coupled to a bit line BL. The sense amplifier enable signal SAE changes to a high level for a predetermined period in response to the basic timing signal RASZ (FIG. 12 (c)). The high level period of the sense amplifier enable signal SAE is a period in which the sense amplifier SA is activated and performs an amplifying operation.

FIG. 12 illustrates an example of performing the self-refresh operation of the memory cells MC coupled to the last word line WL in the row block RBLK1. By performing the self-refresh operation, the refresh address counter 22 illustrated in FIG. 1 performs a count operation, and the refresh address signal RRAD switches for example to an address indicating the row block RBLK2. Accordingly, the block selection signal DBLKSEL1 and the row block signal RBLK1Z are inactivated sequentially to a low level after the self-refresh operation (FIG. 12 (d, e)). The row block pulse signal RBLKSPZ changes to a high level for a predetermined period synchronously with the sense amplifier enable signal SAE (FIG. 12 (f)). The block selection signal BLKSEL1 changes to a high level synchronously with a rising edge of the basic timing signal RASZ, and changes to a low level synchronously with a falling edge of the sense amplifier enable signal SAE (FIG. 12 (g)).

The switch control signals BT1RBL, BT1RBBL corresponding to the row block RBLK1 and the switch control signals BT2LBL, BT2LBBL corresponding to the row block RBLK2 change from a low level VNN to a high level VOO (FIG. 12 (h, i, j, k)) synchronously with the change of the cross cut signal CRSCUT1Z to the low level. The switch control signal BT2LBL corresponding to the row block RBLK2 changes from the high level VOO to a low level VSS synchronously with a falling edge of the control signal MUX-BLOFFX illustrated in FIG. 9 (FIG. 12 (l)). Accordingly, the bit line BL of the row block RBLK2 corresponding to the bit line BL of the row block RBLK1 that is accessed is cut off from the sense amplifier SA by the switch control signal BT2LBL at the low level VSS. The word line WL (not illustrated) of the row block RBLK1 is activated to a high level after the switch control signal BT2LBL changes to the low level.

The switch control signal BT2LBBL corresponding to the row block RBLK2 changes from the high level VOO to a low level VSS synchronously with a falling edge of the control signal MUXBBLOFFX illustrated in FIG. 9 (FIG. 12 (m)). The bit line /BL of the row block RBLK2 corresponding to the bit line /BL (reference voltage) of the row block RBLK1 that is accessed is cut off from the sense amplifier SA later than cutting off of the bit line BL, by the switch control signal BT2LBL at the low level VSS. When data (charge) is read from the memory cells MC to the bit line BL, the coupling of the bit line /BL of the row block RBLK2 that functions as the reference voltage line to the bit line /BL of the row block RBLK1 for a long period can suppress coupling noise in the bit line /BL of the row block RBLK1 to a minimum. Thus, the read margin can be improved.

On the other hand, charges read from the memory cells MC by the switch control signals BT1RBL, BT1RBBL at the high level are transmitted to the sense amplifier SA via the bit line BL. The switch control signals BT1RBL, BT1RBBL of the row block RBLK1 in which the self-refresh operation is performed change temporarily to a low level VMUX synchronously with a falling edge of the control signal MUXC, and change temporarily to a high level VPP synchronously with a falling edge of the control signal BTXBST (FIG. 12 (n, o)). The period of the low level VMUX is a period in which the sense amplifier SA starts an amplifying operation. When the sense amplifier SA starts the amplifying operation, the cutting off of the sense amplifier SA and the row block RBLK1 temporarily can reduce the load on the bit lines BL, /BL coupled to the sense amplifier SA. Accordingly, the amplifying operation of the sense amplifier SA becomes quick, and also the read margin improves.

After the self-refresh operation is completed, the switch control signals BT2LBL, BT2LBBL, BT1RBL, BT1RBBL changes to a high level VOO synchronously with a change of the block selection signal BLKSEL1 to a low level (FIG. 12 (p, q, r, s)). At this time, the precharge control signals BRS1R, BRS2L are retained at a high level VOO. Accordingly, the bit lines BL, /BL of the row blocks RBLK1-2 and the input/output nodes of the sense amplifier SA are set to the precharge voltage VPR. Thereafter, synchronously with a change of the cross cut signal CRSCUT1Z to a high level, the switch control signals BT2LBL, BT2LBBL, BT1RBL, BT1RBBL change from the high level VOO to a low level VNN (FIG. 12 (t, u, v, w)). The bit lines BL, /BL of the row blocks RBLK1-2 are cut off from the sense amplifier SA. Accordingly, in the period in which the self-refresh operation is not performed, it is possible to prevent leak components of the precharge voltage VPR of the sense amplifier activation signals PSA, NSA supplied to the sense amplifier SA from being transmitted to the bit lines BL, /BL of the row blocks RBLK1-2. Therefore, it is possible to prevent a leak current from flowing between the word line WL and the sense amplifier activation signal lines PSA, NSA via the bit lines BL, /BL. That is, the relief operation of cross short failure is performed.

FIG. 13 illustrates another operation of the row control unit RCNT12 illustrated in FIG. 4. This operation shows a state that the fuse FS in FIG. 5 is uncut, or a state that the latch LT2 of the cross latch circuit CRSLT in FIG. 5 is reset in the test mode (the cross latch signal CRSLTZ is at a low level) (first operating specification). With the first operating specification, during a period in which the memory cells MC are not accessed (high level period of the cross start control signal CRSZB), the precharge control signal BRS and the switch control signal BT are set to a high level VOO. Waveforms of a period in which the memory cells MC are accessed (low level period of the cross start control signal CRSZB) are the same as in FIG. 12. Thus, the main BRS generator MBRSGEN and the sub-BRS generator SBSGEN change the output timing of the precharge control signal BRS according to the operating specification signals (cross fuse signal CRSFZ and cross latch signal CRSLTZ). The BT generator BTGEN changes the output timing of the switch control signal BT according to the operating specification signals.

Figure 14:
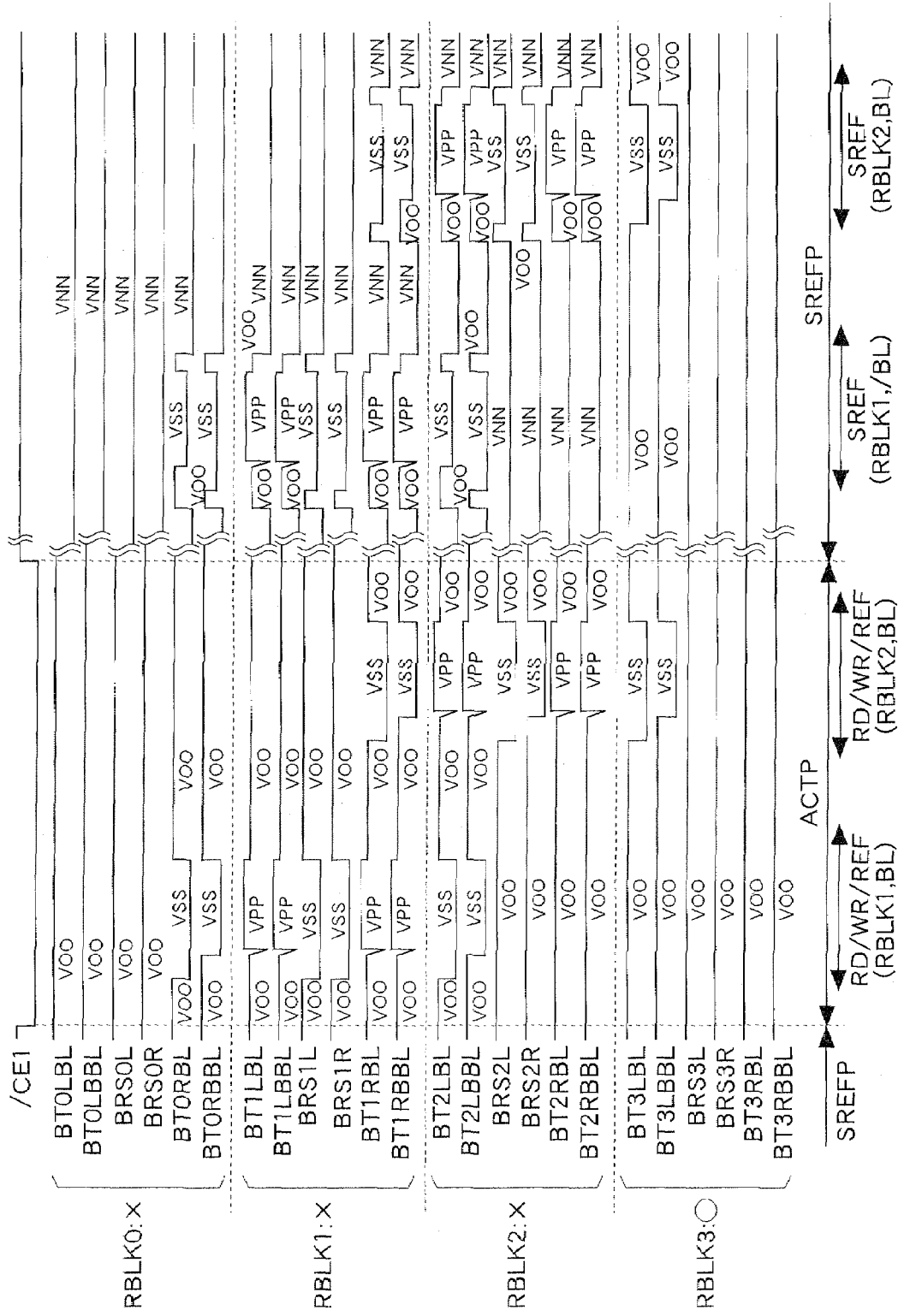
FIG. 14 is a timing chart illustrating an operation in a test mode in the first embodiment.

FIG. 14 illustrates an operation of the semiconductor memory MEM of the first embodiment. This operation shows a state that, similarly to FIG. 12, the fuse FS in FIG. 5 is cut, or a state that the latch LT2 in FIG. 5 is set in the test mode (the CRSLTZ signal is at a high level). In this example, there are cross short failures in the row blocks RBLK0-2 (X marks in FIG. 14), and hence the relief operation of cross short failure is implemented. In the row block RBLK3, there is no cross short failure (circle marks in FIG. 14) and hence the relief operation of cross short failure is not performed.

A period in which the chip enable signal /CE1 is at a low level is an activation period ACTP (active state ACT in FIG. 8) in which the access operation (the read operation RD, the write operation WR or the refresh operation REF) can be performed. In the pseudo SRAM type FCRAM, a refresh request is not received from the outside, and the refresh operation REF is performed only in response to the internal refresh request RREQ. A period in which the chip enable signal /CE1 is at a high level is a self-refresh period SREFP (standby state STBY in FIG. 8) in which only the self-refresh operation SREF is performed.

First, during the activation period ACTP, the access operation (accessing the memory cells MC coupled to the bit line BL) of the row block RBLK1 and the access operation (accessing the memory cells MC coupled to the bit line BL) of the row block RBLK2 are performed sequentially. In the activation period ACTP, the precharge control signal BRS (BRS0L-3L, BRS0R-3R) and a switch control signal BT (BT0LBL-BT3LBL, BT0LBBL-BT3LBBL, BT0RBL-BT3RBL, BT0RBBL-BT3RBBL) are set to a high level VOO when the access operation is not operated. Accordingly, the precharge circuit PRE turns on and the bit lines BL, /BL are set to the precharge voltage VPR. The connection switch BT turns on, and the bit lines BL, /BL of each of the row blocks RBLK0-3 are coupled to the sense amplifier SA. During the activation period ACTP, the consumption current accompanying the access operation is dominant, and therefore the relief operation of cross short failure is not implemented.

Waveforms of the switch control signal BT and the precharge control signal BRS during the access operation in the bad row blocks RBLK0-2 are the same as the waveform of the self-refresh operation SREF except that a start level and a finish level are not the low level VNN but the high level VOO. Specifically, in the row block RBLK performing the access operation, the precharge control signal BRS changes to a low level VSS so as to disable the precharge operation during the access operation. The switch control signal BT changes temporarily to a low level VMUX (FIG. 12) when the sense amplifier SA starts to operate, and is set thereafter to a high level VPP while the sense amplifier SA is activated. In a row block RBLK adjacent to the row block RBLK performing the access operation, the switch control signal BT corresponding to the bit line BL that is accessed changes to a low level VSS earlier than the switch control signal BT corresponding to the reference bit line /BL.

Next, in the self-refresh period SREFP, for example, the self-refresh operations SREF of the row blocks RBLK1-2 are performed sequentially. Waveforms of the self-refresh operation SREF are the same as in FIG. 12. The precharge control signals BRS0L,0R and the switch control signals BT0LBL, BT0LBBL which did not take part in the access operation are set to a low level VNN for eliminating a leak current between the word line WL and the bit line BL (or /BL) accompanying a cross failure and a leak current between the word line WL and the sense amplifier activation signal lines PSA, NSA. Note that in the row block RBLK3 with no failure, the above-described leak currents do not exist, and hence waveforms of the precharge control signals BRS3L, 3R and the switch control signals BT3LBL, BT3LBBL, BT3RBL, BT3RBBL are the same in the activation period ACTP and the self-refresh period SREFP with each other. Specifically, these signals are set to a high level VOO except the access operation period of the adjacent row block RBLK2.

Figure 15:
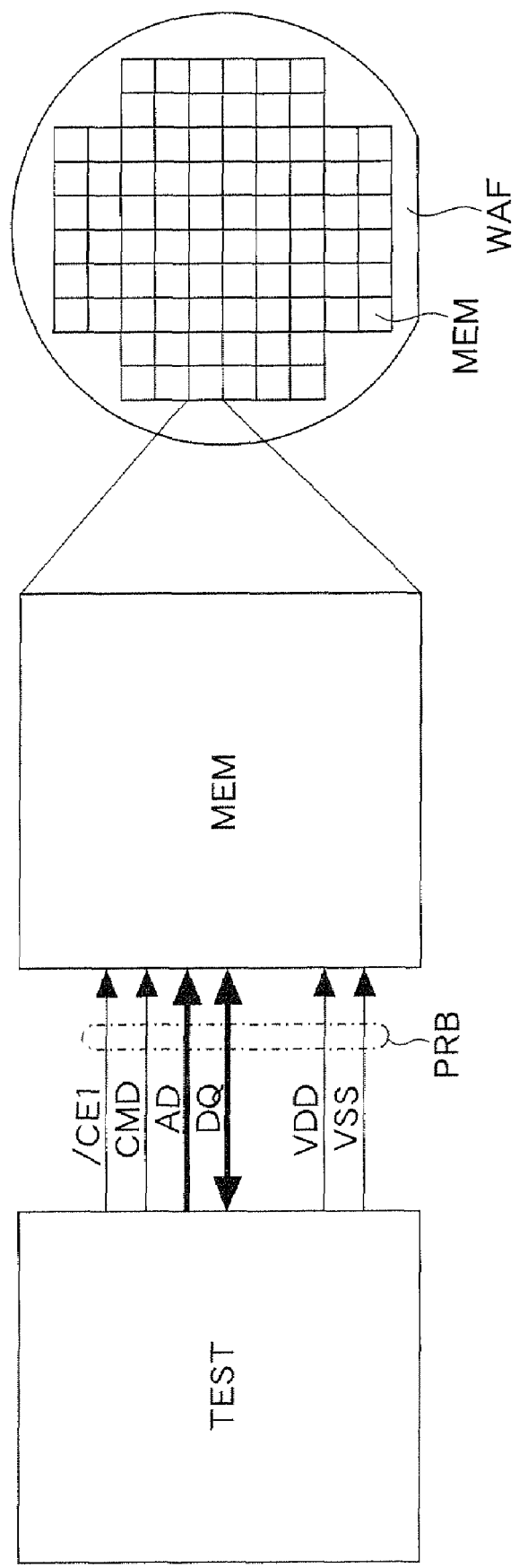
FIG. 15 is a block diagram illustrating a test system in the first embodiment.

FIG. 15 illustrates a test system of the first embodiment. First, a plurality of memories MEM are formed on a semiconductor wafer WAF through a semiconductor manufacturing process. The memories MEM are tested by an LSI tester TEST before being cut off from the wafer WAF. From the LSI tester TEST, not only a control signal but also power supply voltage VDD and ground voltage VSS are supplied. The memories MEM are coupled to the LSI tester TEST via, for example, probes PRB of a not-shown probe card. In FIG. 15, one memory MEM is coupled to the LST tester TEST, but a plurality of (four for example) memories MEM may be coupled at once to the LSI tester TEST. The number of the memories MEM coupled to the LSI tester TEST at once depends on the number of terminals of the LSI tester TEST and the number of terminals of the memory MEM. The LSI tester TEST supplies a chip enable signal /CE1, a command signal CMD, an address signal AD and a write data signal DQ to the memory MEM, and receives a read data signal DQ from the memory MEM. Note that the LSI tester TEST may test the packaged memory MEM.

FIG. 16 illustrates an operation in the test mode in the first embodiment. The operation in FIG. 16 is implemented by a test system illustrated in FIG. 15. Specifically, input signals of the memory MEM such as the command signal CMD and the address signal AD are output from the LSI tester TEST. The address signal AD supplied to the memory MEM together with the test mode register set command TMRS sets a predetermined bit in the test mode register 12.

First, the tester TEST outputs a value that resets a self-refresh bit SSTP in the test mode register 12 together with the command TMRS (FIG. 16 (*a*)). By resetting the bit SSTP, for example, generation of the refresh request signal RREQ by the refresh request generator 20 is disabled, and the self-refresh operation of the memory MEM is stopped. Note that for stopping the self-refresh operation, the refresh disable signal REFDIS output from the test mode register 12 in response to setting the bit SSTP may be supplied to the refresh timer 18 so as to stop the refresh timer 18. Alternatively, the refresh disable signal REFDIS may be supplied to the core control circuit 16 to disable acceptance of the refresh request signal RREQ by the core control circuit 16. As generation of the refresh request signal RREQ is stopped, the relief operation of cross short failure cannot be started in response to the refresh request signal RREQ, unlike FIG. 8. In this example, the relief operation of cross short failure is started in response to the rising edge of the signal /CE1 (in the standby state STBY). The relief operation may be started in response to the refresh disable signal REFDIS, or in response to other test modes.

Next, the tester TEST outputs a value that sets a fuse disable bit FIDS (corresponding to CRS1Z in FIG. 1) together with the command TMRS (FIG. 16 (b)). Accordingly, the fuse disable signal FDISZ is activated to a high level, and the cross fuse signal CRSFZ output from the fuse circuit FUSE illustrated in FIG. 5 is fixed to a low level. Specifically, the state of the programmed fuse FS becomes invalid. With this function, for example, reevaluation of a cross leak failure can be implemented in a memory MEM in which the fuse circuit FUSE is programmed. For example, by implementing evaluation of a memory MEM that is mounted in the system and used for a long period, reliability of the memory MEM can be evaluated.

Next, the tester TEST outputs a value that sets a latch enable bit LEN (corresponding to CRS2Z in FIG. 1) together with the command TMRS (FIG. 16 (c)). Accordingly, the latch enable signal LENX is activated to a low level, and the cross latch circuit CRSLT (illustrated in FIG. 5) releases the reset state and activates the latch LT2. Next, the tester TEST outputs a value that resets a latch mask bit LMSK (corresponding to CRS3Z in FIG. 1) together with the command TMRS (FIG. 16 (d)). Accordingly, the latch mask signal LMSKX is inactivated to a high level, and all the cross latch circuits CRSLT become capable of accepting the block selection signal BLKSEL.

Next, the tester TEST outputs the address of the row block RBLK0 at which the relief operation of cross short failure is implemented, together with the read command RD (FIG. 16 (e)). The cross latch circuit CRSLT corresponding to the row block RBLK0 is set and activates the cross latch signal CRSLT0Z (CRSLTZ) to a high level. The Or-circuit OR illustrated in FIG. 5 activates the cut fuse signal CUTF0Z (CUTFZ) to a high level. Accordingly, in the row block RBLK0, as illustrated in FIG. 12 and FIG. 14, the relief operation of cross short failure is implemented. Note that since the self-refresh operation SREF is disabled, it is possible to prevent that, at the cycle (e) and thereafter, the cross latch circuit CRSLT is set by the self-refresh operation SREF by mistake with the refresh address signal RRAD.

Next, the tester TEST outputs a value that sets the latch mask bit LMSK together with the command TMRS (FIG. 16 (f)). Accordingly, the latch mask signal LMSKX is activated to a low level, and all the cross latch circuits CRSLT disable acceptance of the block selection signal BLKSEL. After this, the state of the cross latch circuit CRSLT does not change even when the block selection signal BLKSEL changes. Thus, for example, the tester TEST can implement the access operation test of the memory MEM.

Next, the tester TEST sets the memory MEM to the standby state STBY (/CE1=high level), and measures a standby current (electric characteristic) (FIG. 16 (g)). Here, a standby current when the relief operation of cross short failure is implemented only in the row block RBLK0 is measured. Note that as described above, the tester TEST can implement the access operation test during the period (g). Next, the tester TEST outputs a value that resets the latch enable bit LEN together with the command TMRS (FIG. 16 (h)). The latch enable signal LENX is inactivated to a high level, and all the cross latch circuits CRSLT are reset, thereby inactivating the latch LT2.

The cycles (i) to (n) are operations corresponding to the above-described cycles (c) to (h). Then, the relief operation of cross short failure is implemented only by the row block RBLK1, and the standby current is measured. The cycles (o) to (t) and the cycles (u) to (x) are also operations corresponding to the above-described cycles (c) to (h). In these cycles, the relief operation of cross short failure is implemented only in the row block RBLK2 or the row block RBLK3, and the standby current is measured. Together with the measurement of the standby current, the access operation test can be implemented as well.

Next, the tester TEST outputs a value that resets the fuse disable bit FIDS together with the command TMRS (FIG. 16 (y)). Accordingly, the fuse disable signal FDISZ is inactivated to a low level, and the cross fuse signal CRSFZ is set to the level according to the program state of the fuse FS. Then, the tester TEST outputs a value that sets the self-refresh bit SSTP together with the command TMRS (FIG. 16 (z)). By setting the bit SSTP, generation of the refresh request signal RREQ is started, and the self-refresh operation SREF is performed periodically. After this, the tester TEST finishes the test, or implements a different operation test.

Based on the above operation, the standby current when the relief operation of cross short failure is implemented in only one of the row blocks RBLK0-3 is compared with the standby current (reference standby current measured in advance) when the relief operation of cross short failure is not performed in all the row blocks RBLK0-3. When the standby current is smaller by not less than a predetermined value than the reference standby current, it is determined that the leak current is decreased by the relief operation. Specifically, the row block RBLK with smaller standby current is determined to be a bad row block having a cross short failure. Based on this determination result, the fuse FS (FIG. 5) of the bad row block is cut in a test step thereafter. For example, the test step is a failure relief step for validating the redundancy word line WL.

Figure 17:
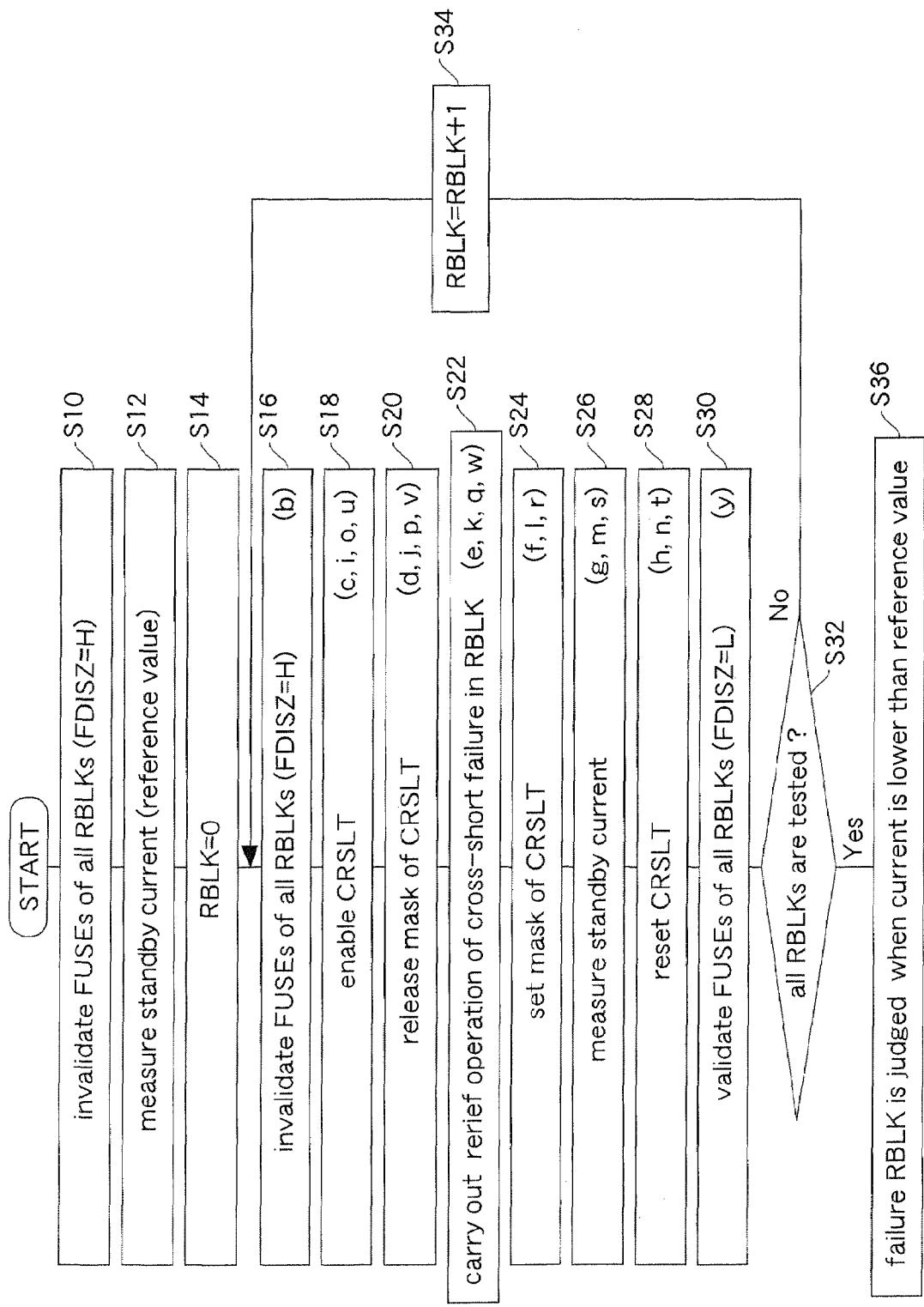
FIG. 17 is a flow chart illustrating an operation in the test mode in the first embodiment.

FIG. 17 illustrates an operation in the test mode of the first embodiment. The flow in FIG. 17 is implemented by the test program of the tester TEST illustrated in FIG. 15. Step S16 to step S34 in the chart are operations corresponding to the cycles (b) to (y) in FIG. 16. Each alphabet in boxes of the flow represents the corresponding cycle in FIG. 15. Flows of the cycles (a), (z) in FIG. 16 are omitted.

First in step S10, so as to invalidate the state of the fuse FS of the fuse circuit FUSE, the fuse disable bit FIDS of the test mode register 12 is set, and the fuse disable signal FDISZ is activated to a high level. In step S12, the reference standby current when the relief operation of cross short failure is not implemented in all the row blocks RBLK0-3 is measured. In step S14, a register or the like in the tester TEST is used to reset the number of the row block RBLK to be tested is reset to "0" (RBLK0).

Thereafter, as illustrated in FIG. 16, in steps S16 to S34, the standby current when the relief operation of cross short failure is implemented in each of the row blocks RBLK0-3 is measured. Then, in step S36, when the standby current is smaller than the reference standby current, the row block RBLK in which the relief operation of cross short failure is implemented is determined to be a bad row block RBLK having a cross short failure.

FIG. 18 illustrates a system SYS of the first embodiment. Note that in the embodiments which will be described later the same system as FIG. 18 is formed. The system is formed as, for example, a system in package SIP integrated on a silicon substrate. The SIP has the memory MEM illustrated in FIG. 1, a flash memory FLASH, a memory controller MCNT that accesses the flash memory FLASH, and a CPU (controller) that controls the entire system. The CPU, the memory MEM, and the memory controller MCNT are coupled to one another by a system bus SBUS. The SIP may be coupled to a higher rank system via an external bus. The SIP is a portable equipment such as a mobile phone or the like for example. The CPU outputs the chip enable signal /CE1, the command signal CMD, an address signal ADD, and the write data signal DQ in order to access the memory MEM and receives the read data signal DQ from the memory MEM.

As above, in the first embodiment, the standby current of the semiconductor memory MEM can be evaluated while changing output timings of the precharge control signal BRS and the switch control signal BT for each of the row blocks RBLK0-3. In other words, the semiconductor memory MEM can be operated in the same state as a state that the program circuit FUSE is programmed, and the presence of a standby current failure (cross short failure) can be determined for each of the row blocks RBLK0-3.

The output timings of the precharge control signal BTS and the switch control signal BT can be set to each of the row blocks RBLK using the block selection signal BLKSEL. Accordingly, it is not necessary to newly wire a dedicated signal line for setting each cross latch circuit CRSLT. Since the wiring region for such a signal line is not necessary, detection and relief of a standby current failure (cross short failure) can be implemented while minimizing increase in chip size of the semiconductor memory MEM.

By arranging the fuse circuit FUSE, the cross latch circuit CRSLT and the cross control circuit CRSCNT adjacent to the corresponding row blocks RBLK, the signal lines to control the relief operation of cross short failure are not needed to be wired from the outside of the memory core 32. The wiring lengths of such signal lines can be shortened and the wiring regions thereof can be minimized, and thus the increase in chip size of the memory MEM can be prevented.

Figure 19:
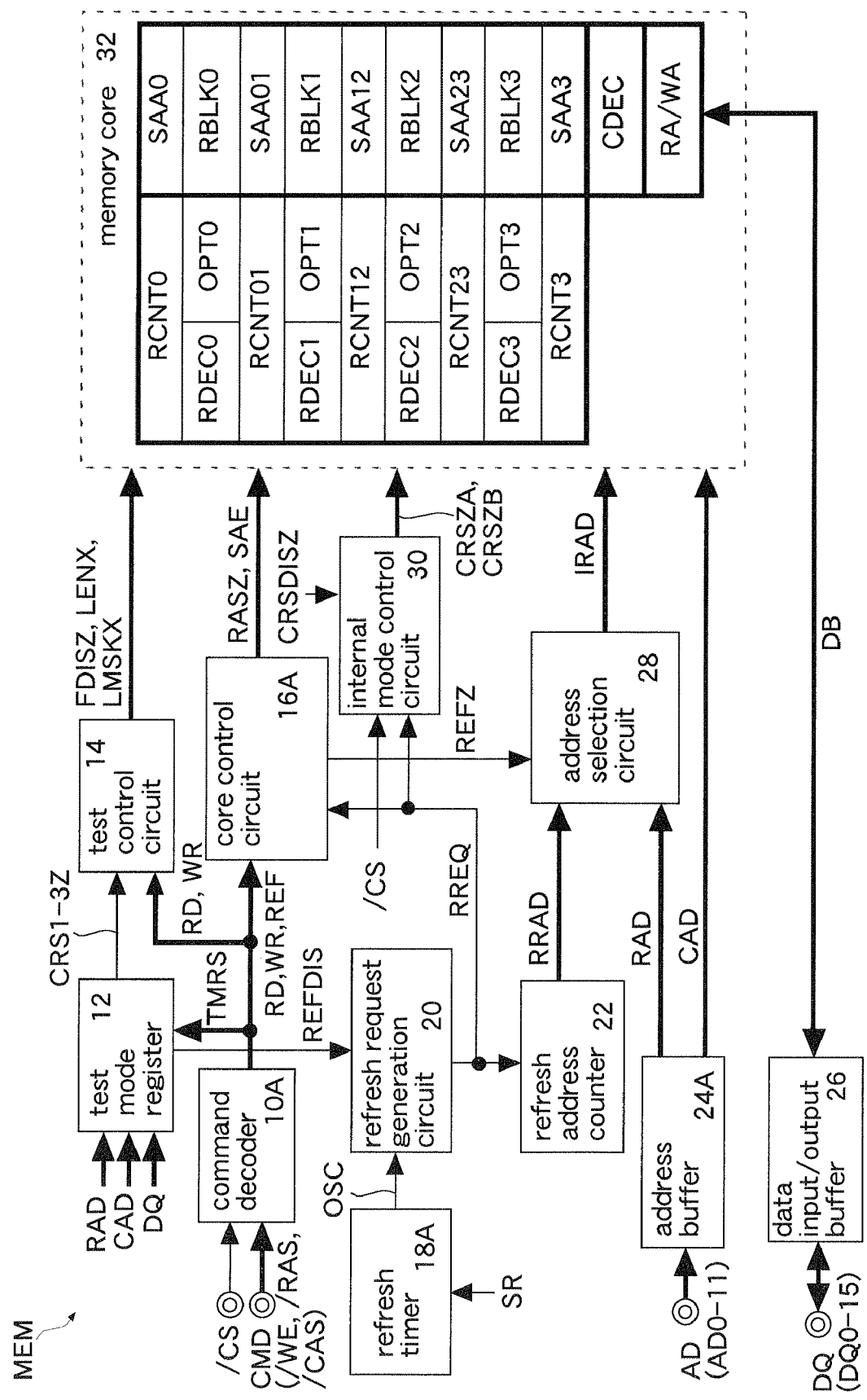
FIG. 19 is a block diagram illustrating a second embodiment.

FIG. 19 illustrates a second embodiment. The same elements as those explained in the first embodiment are given the same reference signs, and detailed explanations thereof are omitted. In this embodiment, the semiconductor memory MEM is a DRAM. The semiconductor memory MEM has a command decoder 10A, a core control circuit 16A, a refresh timer 18A, and an address buffer 24A instead of the command decoder 10, the core control circuit 16, the refresh timer 18, and the address buffer 24 of the first embodiment. The other structure is the same as in the first embodiment. The memory MEM has a redundancy circuit, a redundancy fuse circuit and a redundancy control circuit for relieving bad memory cells or the like, which are not illustrated. The above-described FIG. 2 to FIG. 18 are also applied to this embodiment. However, in the test system illustrated in FIG. 15 and the system illustrated in FIG. 18, a signal for accessing the DRAM is supplied to the memory MEM.

The command decoder 10A outputs a command, which is recognized according to logic levels of a chip select signal /CS and a command signal CMD, as a read command RD, a write command WR and a refresh command REF (external refresh request) or a test mode register set command TMRS for setting the test mode register 12 or the like, so as to perform an access operation of the memory core 32. The function of the chip select signal /CS is the same as that of the chip enable signal /CE1. The command signal CMD includes, for example, a write enable signal /WE, a row address strobe signal /RAS and a column address strobe signal /CAS.

The core control circuit 16A is formed by excluding the arbiter ARB from the core control circuit 16 of the first embodiment. The refresh signal REFZ is generated in response to the refresh command REF or the refresh request RREQ. The refresh timer 18A generates an oscillating signal OSC only while receiving the self-refresh signal SR indicating the self-refresh mode. The oscillating signal OSC is not generated during the normal operation mode in which the read command RD, the write command WR and the refresh command REF can be supplied. The self-refresh mode is entered upon reception of a self-refresh command during the normal operation mode.

The address buffer 24A receives a row address signal RAD and a column address signal CAD supplied sequentially to common address terminals (for example, AD0-11). Specifically, this memory MEM adopts the address multiplex method. As above, also in the second embodiment, the same effects as those of the above-described first embodiment can be obtained. Specifically, also in a DRAM, regardless of the program state of the fuse circuit FUSE, the relief operation of a cross leak failure can be set to each of the row blocks RBLK0-3.

Figure 20:
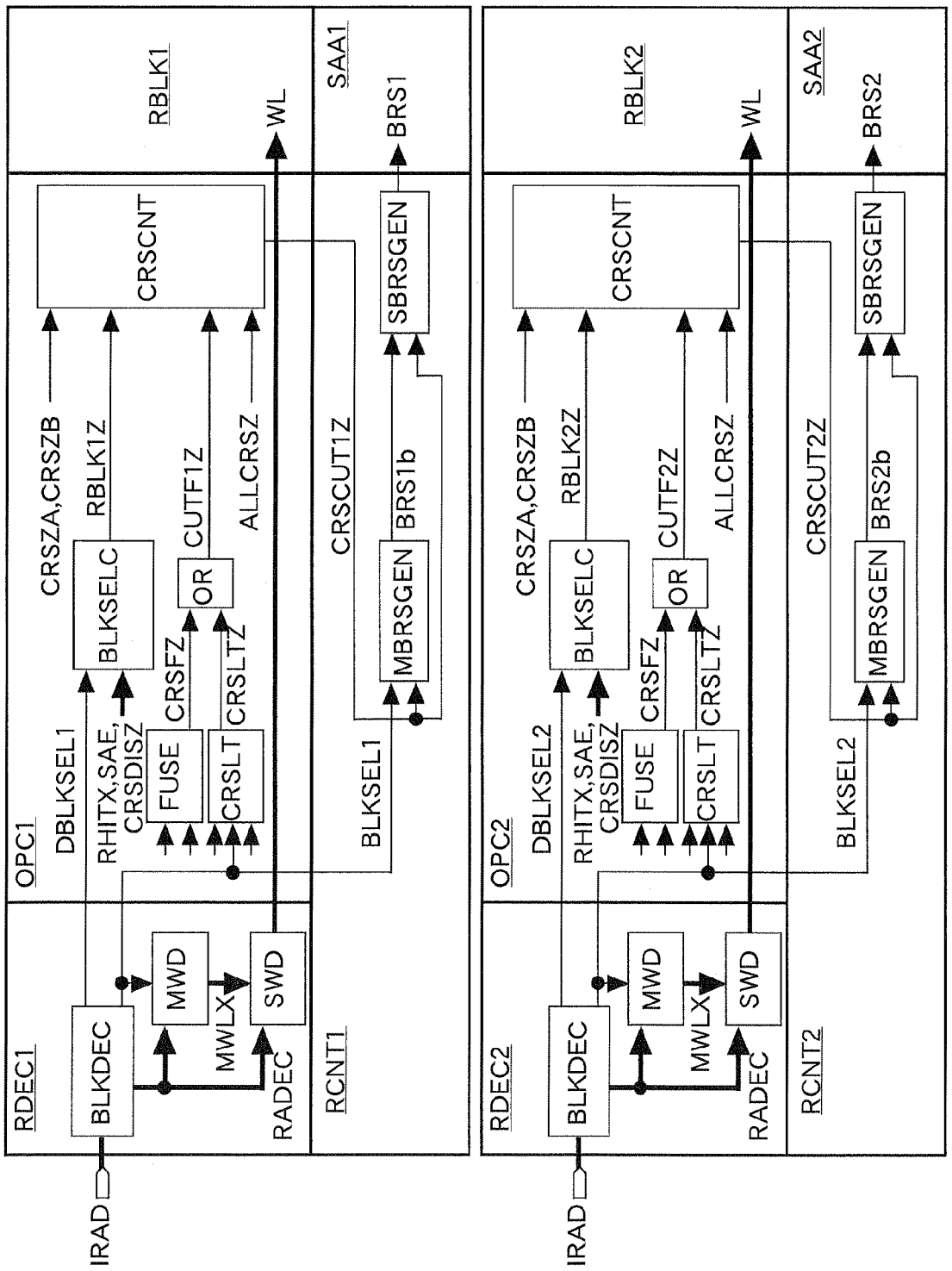
FIG. 20 is a block diagram illustrating a substantial part of a memory core in a third embodiment.

FIG. 20 illustrates a substantial part of a memory core in a third embodiment. The same elements as those explained in the first embodiment are given the same reference signs, and detailed explanations thereof are omitted. In this embodiment, the semiconductor memory is an FCRAM of pseudo SRAM type.

The memory core of the semiconductor memory has four row blocks RBLK0-3, and four sense amplifier areas SAA and four row control units RCNT coupled independently to the row blocks RBLK0-3 respectively. In FIG. 20, areas corresponding to the row blocks RBLK1-2 are illustrated. The sense amplifier SA of each sense amplifier area SAA is not shared by a plurality of row blocks RBLK, and hence the row control units RCNT (RCNT1-2; (timing control circuit) do not have the BT generator BTGEN (switch generator) which generates the switch control signal BT. Further, the cross control circuit CRSCNT (operation signal generator) receives only the corresponding row block signal RBLKZ (RBLK1Z or RBLK2Z) and outputs the cross cut signal CRSCUTZ (CRSCUT1Z or CRSCUT2Z). The sense amplifier areas SAA are each formed by a precharge circuit PRE, a sense amplifier SA and a column switch CSW of FIG. 3, but do not have the connection switch BT. The other structure is the same as in the first embodiment.

The test system in FIG. 15 and the system in FIG. 18 described above are also applied to this embodiment. The operation of the test mode is the same as in FIG. 16, FIG. 17. In this embodiment, as illustrated in FIG. 11, the output timing of the precharge control signal BRS is changed according to whether the relief operation of cross short failure is implemented or not. Specifically, according to whether the cross cut signal CRSCUTZ (operating specification signal) indicates the first operating specification or the second operating specification, it is determined whether to couple the bit lines BL, /BL to the precharge voltage line VPR or not in a period in which the memory cells MC are not accessed.

As above, also in the third embodiment, the same effects as those of the above-described first embodiment can be obtained. Specifically, when changing the output timing of only the precharge control signal BRS, the bit lines BL, /BL are set to a floating state in a period in which the access operation is not performed, and hence it is possible to prevent a leak current from flowing between the word line WL and the bit line BL (or /BL).

Note that examples of applying the present invention to a semiconductor memory of clock asynchronous type are explained in the above-described embodiments. The present invention is not limited to such embodiments. For example, the present invention may be applied to a semiconductor memory of clock synchronous type.

In the above-described embodiments, examples of applying the present invention to a pseudo SRAM such as an FCRAM or to a DRAM are explained. The present invention is not limited to such embodiments. For example, the present invention may be applied to a different semiconductor memory such as an SRAM or a ferroelectric memory.

In the above-described embodiments, examples of using the cross latch circuit CRSLT in evaluation for programming the fuse FS are explained. The present invention is not limited to such embodiments. For example, the cross latch circuit CRSLT may be used in a memory MEM in which the fuse FS is already programmed, so as to invalidate the program state thereof and test the memory MEM.

A proposition of the embodiments is to detect a failure of electric characteristic such as cross short failure in each of memory blocks and relief the failure. Particularly, an object of the present invention is to perform detection and relief of a failure of electric characteristic while minimizing the increase in chip size.

For example, the bit lines are coupled to the precharge voltage line by a precharge control signal during a period in which the memory cells are not accessed when the operating specification signal indicates the first operating specification. The bit lines are cut off from the precharge voltage line by the precharge control signal during a period in which the memory cells are not accessed when the operating specification signal indicates the second operating specification. The operating specification signal indicating the first or second operating specification can be output from the specification changing circuit before programming the program circuits. Accordingly, an output timing of the precharge control signal is changed for each of the memory blocks, and an electric characteristic of the semiconductor memory can be evaluated. In other words, the semiconductor memory can be operated in the same state as a state that the program circuits are programmed, and an electric characteristic failure can be determined for each of the memory blocks.

The output timing of the precharge control signal can be set for each of the memory blocks using the block selection signal. Accordingly, it is not necessary to newly wire a dedicated signal line for setting each specification changing circuit. Since the wiring region for such a signal line is not necessary, detection and relief of the electric characteristic failure can be implemented while minimizing increase in chip size of the semiconductor memory.

For example, in the evaluation of the electric characteristic, first, a standby current of the semiconductor memory is measured in a state that each of the specification changing circuits is not set. Next, one of the specification changing circuits is set so as to operate one of the memory blocks with the second operating specification. Then, a standby current of the semiconductor memory is measured. If a standby current when the one of the specification changing circuits is set is smaller by not less than a predetermined value than a standby current when the specification changing circuits are not set, it is determined that there is an electric characteristic failure in the corresponding row block. Specifically, it is determined that the current decreases by operating the bad row block with the second operating specification. Then, a program unit corresponding to the specification changing circuit is programmed, and the failure is relieved.

For example, the block control circuits are each arranged corresponding to a pair of the memory blocks adjacent to each other. The block control circuits each have a sense amplifier arranged in common to a pair of the memory blocks and a plurality of switches which turn on according to a switch control signal so as to couple the bit lines to the sense amplifier respectively. The timing control circuits each have a switch generator which outputs the switch control signal and changes an output timing of the switch control signal according to the operating specification signal. Accordingly, the output timings of both the precharge control signal and the switch control signal can be changed according to the operating specification signal, and the electric characteristic of the semiconductor memory can be evaluated.

For example, the program circuit and the specification changing circuit are arranged adjacent to the corresponding memory block. Accordingly, a wiring length of a control signal line controlling an output timing of a control signal can be shortened. Consequently, a wiring region of such a signal line can be minimized, and increase in chip size of the semiconductor memory can be prevented.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
   a plurality of memory blocks each having a memory cell and a bit line coupled to the memory cells;
   a decoder which activates one of block selection signals configured to select the memory blocks according to an address signal;
   a plurality of block control circuits provided corresponding to the memory blocks, the block control circuits each having a precharge circuit which couples the bit line to a precharge voltage line according to a precharge control signal;
   a plurality of program circuits provided corresponding to the memory blocks, the program circuits each having a non-volatile program unit, outputting an operating specification signal indicating a first operation specification when the program unit is not programmed, and outputting an operating specification signal indicating a second operating specification when the program unit is programmed;
   a plurality of specification changing circuits provided corresponding to the memory blocks, the specification changing circuits being set in response to activation of a corresponding block selection signal during a test mode, outputting the operating specification signal indicating the second operating specification while being set, and outputting the operating specification signal indicating the first operating specification when not being set; and
   a plurality of timing control circuits provided corresponding to the block control circuits, the timing control circuits each having a precharge generator which outputs the precharge control signal and changes an output timing of the precharge control signal according to the operating specification signal from the program circuit or the specification changing circuit.

2. The semiconductor memory according to claim 1, wherein the timing control circuits each output:
   the precharge control signal so as to couple the bit line to the precharge voltage line during a period in which the memory cell is not accessed when the operating specification signal indicates the first operating specification; and the precharge control signal so as to cut off the bit line from the precharge voltage line during a period in which the memory cell is not accessed when the operating specification signal indicates the second operating specification.

3. The semiconductor memory according to claim 2, wherein:

the block control circuits are each arranged corresponding to a pair of the memory blocks adjacent to each other;

the block control circuits each have a sense amplifier arranged in common to the pair of the memory blocks and a plurality of switches which turn on according to a switch control signal so as to couple the bit line to the sense amplifier respectively; and the timing control circuits each have a switch generator which outputs the switch control signal and changes an output timing of the switch control signal according to the operating specification signal.

4. The semiconductor memory according to claim 1, wherein the program circuits each comprise a mask circuit which masks output of the operating specification signal during the test mode.

5. The semiconductor memory according to claim 1, further comprising:

an internal mode control circuit which inactivates a mode control signal during an activation period in which a read operation and a write operation of the memory cell is performed, and activates the mode control signal during a standby period in which the read operation and the write operation of the memory cell is disabled; and an operation signal generator which outputs an operation control signal indicating the first operating specification regardless of the operating specification signal when the mode control signal is inactivated, and outputs an operation control signal indicating one of the first and second operating specification according to the operating specification signal when the mode control signal is activated, wherein the timing control circuit receives the operation control signal as the operating specification signal to operate.

6. The semiconductor memory according to claim 5, wherein the internal mode control circuit activates the mode control signal when a predetermined time passes after switching from the activation period to the standby period.

7. The semiconductor memory according to claim 6, further comprising a refresh request generator which generates periodically a refresh request configured to perform a refresh operation of the memory cell, wherein the predetermined time is a time at which the refresh request is generated a predetermined number of times.

8. The semiconductor memory according to claim 5, further comprising a refresh request generator which generates periodically a refresh request configured to perform a refresh operation of the memory cell, wherein the standby period is a self-refresh period in which only the refresh operation is performed periodically.

9. The semiconductor memory according to claim 1, wherein the specification changing circuits each comprise:

a latch which becomes operable during activation of an enable signal, the latch being set in response to the corresponding block selection signal and outputting the operating specification signal indicating the second operating specification; and a reset circuit which resets the latch in response to inactivation of the enable signal.

10. The semiconductor memory according to claim 9, wherein the specification changing circuits each comprise a mask circuit which disables acceptance of the corresponding block selection signal during activation of a mask signal.

11. The semiconductor memory according to claim 1, further comprising a refresh request generator which generates periodically a refresh request configured to perform a refresh operation of the memory cell, and a refresh disable circuit which disables the refresh operation during a period in which the test mode is set.

12. The semiconductor memory according to claim 1, wherein the program circuit and the specification changing circuit are arranged adjacent to a corresponding memory block.

13. A test method of a semiconductor memory, including:

a plurality of memory blocks each having a memory cell and a bit line coupled to the memory cells;

a decoder which activates one of block selection signals configured to select the memory blocks according to an address signal;

a plurality of block control circuits provided corresponding to the memory blocks, the block control circuits each having a precharge circuit which couples the bit line to a precharge voltage line according to a precharge control signal;

a plurality of program circuits provided corresponding to the memory blocks, the program circuits each having a non-volatile program unit, outputting an operating specification signal indicating a first operation specification when the program unit is not programmed, and outputting an operating specification signal indicating a second operating specification when the program unit is programmed;

a plurality of specification changing circuits provided corresponding to the memory blocks, the specification changing circuits being set in response to activation of a corresponding block selection signal during a test mode, outputting the operating specification signal indicating the second operating specification while being set, and outputting the operating specification signal indicating the first operating specification when not being set; and a plurality of timing control circuits provided corresponding to the block control circuits, the timing control circuits each having a precharge generator which outputs the precharge control signal and changes an output timing of the precharge control signal according to the operating specification signal from the program circuit or the specification changing circuit, and the test method comprising:

measuring a standby current of the semiconductor memory in a state that each of the specification changing circuits is not set;

setting one of the specification changing circuits so as to operate one of the memory blocks with the second operating specification;

measuring a second current of the semiconductor memory; and programming the program unit corresponding to one of the specification changing circuits if the second standby current when the one of the specification changing circuits is set is smaller by not less than a predetermined value than the standby current when the specification changing circuits are not set.

14. The test method of the semiconductor memory according to claim 13, further comprising, before measuring the second standby current of the semiconductor memory in which one of the memory blocks operates with the second operating specification:

supplying the semiconductor memory with a test signal configured to activate an enable signal which makes a latch operable, the latch being provided in each of the specification changing circuits and set in response to the corresponding block selection signal; and accessing a memory block to be operated with the second operating specification so as to output the operating specification signal indicating the second operating specification from the latch by setting the latch.

15. The test method of the semiconductor memory according to claim 14, further comprising, before measuring the second standby current of the semiconductor memory after the memory block is accessed, supplying the semiconductor memory with a test signal configured to activate a mask signal which validates a mask circuit provided in each of the specification changing circuits so as to disable acceptance of the corresponding block selection signal.

16. The test method of the semiconductor memory according to claim 13, further comprising, before setting the specification changing circuit, supplying the semiconductor memory with a test signal configured to validate a refresh disable circuit which disables a refresh operation performed in response to a refresh request output from a refresh request generator.

17. A system comprising a semiconductor memory and a controller accessing the semiconductor memory, wherein the semiconductor memory comprises:

a plurality of memory blocks each having a memory cell and a bit line coupled to the memory cells;

a decoder which activates one of block selection signals configured to select the memory blocks according to an address signal;

a plurality of block control circuits provided corresponding to the memory blocks, the block control circuits each having a precharge circuit which couples the bit line to a precharge voltage line according to a precharge control signal;

a plurality of program circuits provided corresponding to the memory blocks, the program circuits each having a non-volatile program unit, outputting an operating specification signal indicating a first operation specification when the program unit is not programmed, and outputting an operating specification signal indicating a second operating specification when the program unit is programmed;

a plurality of specification changing circuits provided corresponding to the memory blocks, the specification changing circuits being set in response to activation of a corresponding block selection signal during a test mode, outputting the operating specification signal indicating the second operating specification while being set, and outputting the operating specification signal indicating the first operating specification when not being set; and a plurality of timing control circuits provided corresponding to the block control circuits, the timing control circuits each having a precharge generator which outputs the precharge control signal and changes an output timing of the precharge control signal according to the operating specification signal from the program circuit or the specification changing circuit.

* * * * *